(12) United States Patent
Gaku et al.

(10) Patent No.: US 7,140,103 B2
(45) Date of Patent: Nov. 28, 2006

(54) PROCESS FOR THE PRODUCTION OF HIGH-DENSITY PRINTED WIRING BOARD

(75) Inventors: Morio Gaku, Tokyo (JP); Nobuyuk Ikeguchi, Tokyo (JP); Katsuji Komatsu, Tokyo (JP); Yasuo Tanaka, Tokyo (JP); Keiichi Iwata, Tokyo (JP); Ken-ichi Shimizu, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 624 days.

(21) Appl. No.: 10/170,614

(22) Filed: Jun. 14, 2002

(65) Prior Publication Data

US 2003/0049913 A1   Mar. 13, 2003

(30) Foreign Application Priority Data

| Jun. 29, 2001 | (JP) | ............................. 2001-198728 |
| Sep. 20, 2001 | (JP) | ............................. 2001-287155 |
| Feb. 15, 2002 | (JP) | ............................. 2002-038154 |
| Feb. 15, 2002 | (JP) | ............................. 2002-038155 |

(51) Int. Cl.
*H01K 3/10* (2006.01)

(52) U.S. Cl. ............................. 29/852; 29/846; 427/97; 427/99

(58) Field of Classification Search .................. 29/846, 29/852; 427/97, 99
See application file for complete search history.

(56) References Cited

U.S. PATENT DOCUMENTS 5,372,914 A * 12/1994 Naito et al. .................. 430/296

| 6,240,636 B1 * | 6/2001 | Asai et al. ..................... 29/852 |
| 6,570,098 B1 * | 5/2003 | Shimizu et al. ............. 174/255 |
| 6,671,949 B1 * | 1/2004 | Yoshioka et al. ............. 29/852 |
| 6,708,404 B1 * | 3/2004 | Gaku et al. .................... 29/852 |

* cited by examiner

*Primary Examiner*—Richard Chang
(74) *Attorney, Agent, or Firm*—Wenderoth, Lind & Ponack, L.L.P.

(57) ABSTRACT

Process for producing a high-density printed wiring board, comprising:
  providing an ultrathin-copper-foil-clad board having a hole and outermost copper foil thickness of 5 μm or less, plating the surface by electroless copper plating to form a layer of 0.1 to 1 μm thickness,
  forming an electrolytic copper plating layer of 0.5 to 3 μm thickness using the electroless copper plating layer as electrode,
  forming a plating resist layer on a portion of the copper plating layer,
  forming a pattern copper plating layer of 6 to 30 μm thickness on the copper surface in where the plating resist layer is not formed, by electrolytic plating,
  removing the plating resist layer, and
  etching the entire surface to remove the thin electrolytic copper layer, the electroless copper layer and ultrathin copper foil layer at least where the pattern copper plating layer is not formed.

8 Claims, 14 Drawing Sheets

PROCESS FOR THE PRODUCTION OF HIGH-DENSITY PRINTED WIRING BOARD

FIELD OF THE INVENTION

The present invention relates to a process for the production of a printed wiring board having an ultrafine pattern of a line/space, e.g., a pattern having a line/space of 40/40 μm or less, furthermore 20/20 μm or less. An obtained high-density printed wiring board having an ultrafine pattern is mainly used for a novel semiconductor plastic package.

BACKGROUND OF THE INVENTION

Conventionally, as a method for producing a fine pattern in a high-density printed wiring board used for a semiconductor plastic package, there is a method according to a subtractive process in which a through hole and/or a blind via hole is/are made in an ultrathin copper foil having a thickness of 5 μm or less with a mechanical drill or a carbon dioxide gas laser, then electroless copper plating is carried out to form a plating layer having a thickness of 0.5 to 3 μm, a negative type plating resist is formed, a copper plating layer having a thickness of approximately 15 μm is formed, the plating resist is removed and then the electroless copper plating and the ultrathin copper foil are removed by etching (flash etching). Since this method uses a negative type etching film, a negative type dry plate for exposure is placed thereon and exposure is carried out. In this method, it is difficult to form a pattern of 10 μm or less. Furthermore, the above method is insufficient with regard to a pattern location accuracy. On the other hand, there has been widely known a method of producing a pattern of a semiconductor device or a liquid crystal device by the use of a positive type resist. However, there has not been known a method of producing a fine pattern of a printed wiring board by the use of a positive type resist by flash etching.

Further, there is known a method in which a thorough hole and/or a blind via hole is/are made by directly irradiating a copper foil surface with a carbon dioxide gas laser, then copper foil burrs occurring in the hole portion are dissolved and removed, at the same time copper foils as external layers are dissolved and removed by SUEP (Surface Uniform Etching Process) until the thickness of each of the copper foils decreases from 12 μm to 5 μm or less, then a desmearing treatment is carried out, then copper plating is carried out to form a plating layer of approximately 15 μm, and an ultrafine pattern is formed by using a general etching resist. In this method, the upper portion of the pattern becomes narrower than the bottom portion because of the etching so that a cross section becomes trapezoidal or triangular, which causes the occurrence of defectives.

Further, there is a method in which, after plating is carried out by a semi-additive method, an ultrafine pattern is similarly formed by using an etching resist, etc. In this method, when the thickness of copper plating is thick or approximately 18 μm, a problem is that an obtained pattern form is similar to the above forms. When the thickness is thin or approximately 10 μm, the thickness of plating attached in a hole portion is insufficient so that reliability is poor. Further, there is also a problem with regard to adhesive strength to copper.

Further, when copper plating is carried out by a fully additive method, a problem is that copper foil adhesive strength is low even if the thickness of a copper layer is thick. On the other hand, there are a method in which an ultrathin copper foil is used, a plating layer is formed thereon by electroless copper plating and then a pattern is formed by a pattern copper plating method, and a method in which a thin electroless copper layer is formed on a substrate by a semi additive method and a pattern is formed by using the electroless copper layer by a pattern copper plating method. In these methods, however, the electroless copper layer is etched at its sides by a final flash etching to cause undercuts so that the above methods have a problem in adhesive strength to copper.

SUMMARY OF THE INVENTION

It is an object of the present invention to provide a process for producing a printed wiring board which has an ultrafine pattern having an excellent form almost free from undercuts and retaining copper foil adhesive strength by a subtractive process.

It is another object of the present invention to provide a process for producing a printed wiring board having a fine pattern, in particular a fine pattern having a line/space=40/40 μm or less, preferably 20/20 μm or less, by using a plating resist for a pattern formation.

It is further another object of the present invention to provide a process for producing a high-density printed wiring board by forming a pattern by the use of a positive type resist as a plating resist for pattern formation which printed wiring board is almost free from the occurrence of defective and is excellent in pattern location accuracy when compared with a case using a negative plating resist.

According to the present invention 1, there is provided a process for the production of a high-density printed wiring board, comprising the steps of (1) providing an ultrathin-copper-foil-clad board having a through hole and/or a blind via hole formed therein and having an outermost copper foil thickness of 5 μm or less, plating the surface thereof including the inside of the hole by electroless copper plating to form an electroless copper plating layer having a thickness of 0.1 to 1 μm, (2) forming an electrolytic copper plating layer having a thickness of 0.5 to 3 μm by using the electroless copper plating deposited layer as an electrode, (3) forming a plating resist layer for pattern electrolytic copper plating on a necessary portion of the copper plating layer, (4) forming a pattern copper plating layer having a thickness of 6 to 30 μm on the copper surface in a portion where the plating resist layer is not formed, by electrolytic copper plating, (5) removing the plating resist layer, and (6) etching the entire surface to dissolve and remove the thin electrolytic copper layer, the electroless copper layer and the ultrathin copper foil layer in at least a portion where the pattern copper plating layer is not formed, thereby producing an ultrafine pattern.

According to the present invention 2, further, there is provided a process for the production of a high-density printed wiring board according to the above, wherein the plating resist layer is a positive type resist layer and, after the above positive plating resist layer is formed, exposure to an ultraviolet laser beam is carried out and then the plating resist layer in a portion exposed to the ultraviolet laser beam is dissolved and removed.

According to the present invention 3, further, there is provided a process for the production of a high-density printed wring board, comprising the steps of (1) providing an electrolytic copper foil of which one surface has a roughness, forming a 0.1 to 5 μm thick layer of nickel and/or cobalt or an alloy thereof on the one surface having a roughness, disposing the so-prepared electrolytic copper foils such that the copper foil surfaces of the electrolytic copper foils become outermost layers, to prepare a double-side copper-clad board or a multilayer double-side copper-clad board, removing the copper layers as the external layers by etching, to leave the nickel and/or cobalt layers or the alloy layers, (2) plating the surface including the inside of a hole by electroless copper plating to form an electroless copper plating layer having a thickness of 0.1 to 1 μm, (3) forming an electrolytic copper plating layer having a thickness of 0.5 to 3 μm by using the above electroless copper plating deposited layer as an electrode, (4) forming a plating resist layer for pattern electrolytic plating on a necessary portion of the copper plating deposited layer, (5) forming a pattern copper plating layer having a thickness of 6 to 30 μm on the copper surface in a portion where the plating resist layer is not formed, by electrolytic copper plating, (6) removing the plating resist layer, (7) etching the entire surface with a chemical which hardly dissolve the nickel and/or cobalt layers or the alloy layers to remove the thin electrolytic copper layer and the electroless copper layer in at least a portion where the pattern copper plating layer is not formed and to leave the nickel and/or cobalt layers or the alloy layers, and (8) etching the entire surface with a chemical which hardly dissolve copper to dissolve and remove the nickel and/or cobalt layers or the alloy layers.

According to the present invention 4, further, there is provided a process for the production of a high-density printed wiring board according to the present invention 3, wherein the step (1) of the present invention 3 is a step of forming a 0.1 to 3 μm thick layer of nickel and/or cobalt or an alloy thereof on one surface of a copper foil sheet, forming a roughness of 0.5 to 5 μm thereon by further forming a layer of nickel and/or cobalt or an alloy thereof to prepare a copper foil sheet-attached metal foil, carrying out a laminate-formation by disposing the so-obtained copper foil sheet-attached metal foils such that the copper foil sheets of the copper foil sheet-attached metal foils become outermost layers, to obtain a double-side copper-clad board or a multilayer copper-clad board, and removing the copper foil sheets from the double-side copper-clad board or the multilayer copper-clad board to leave the layers of nickel and/or cobalt or the layers of an alloy thereof.

DETAILED DESCRIPTION OF THE INVENTION

Figure 1:
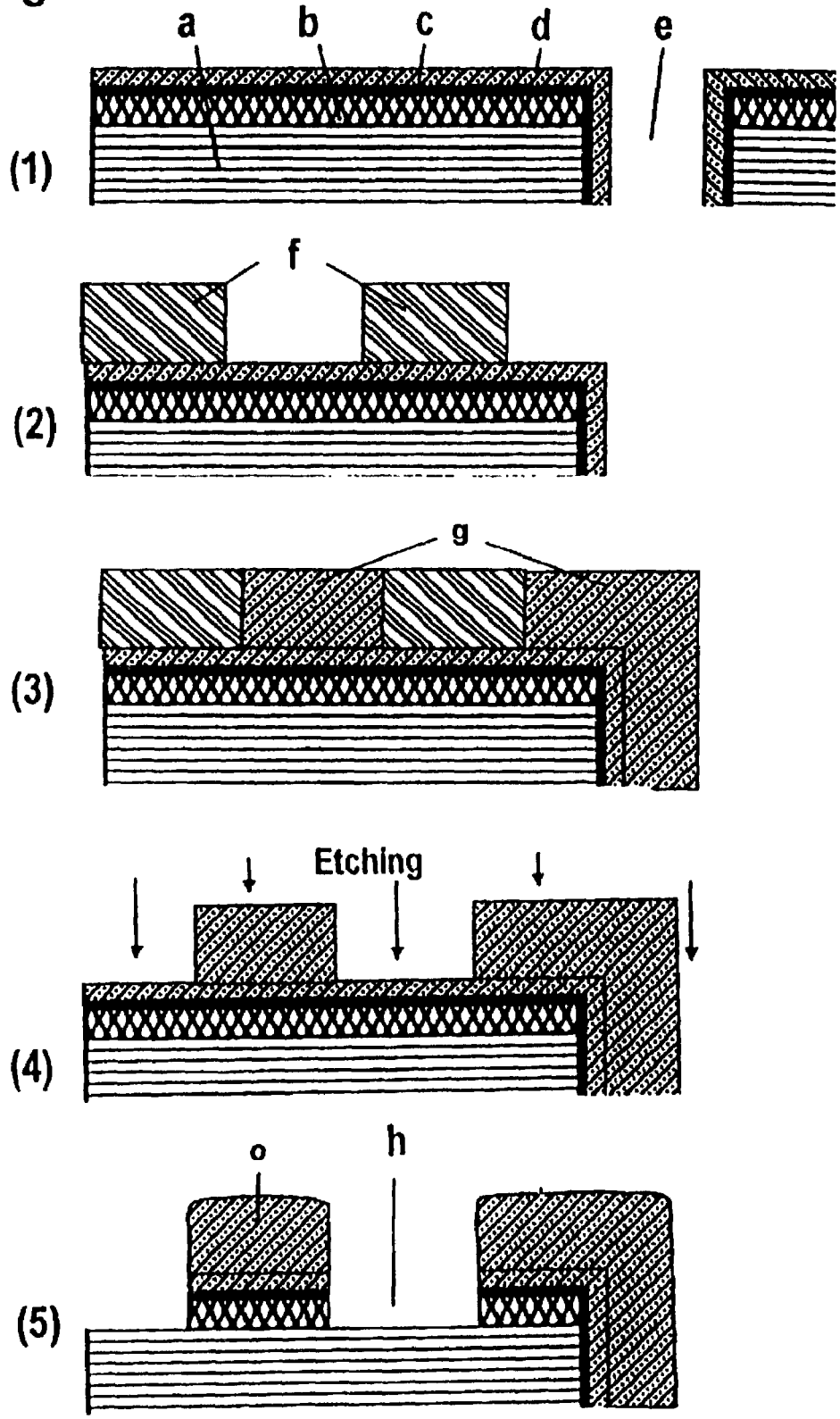
FIG. 1 is a process drawing showing steps of forming a fine pattern in Example 1.

The present invention relates to a process for producing a high-density printed wiring board having a fine pattern of a line/space=40/40 μm or less, preferably 20/20 μm or less, by using a copper-clad board having a general thin copper foil having a thickness of 5 μm or less.

In the present invention, symbols in Drawings have following meanings.

a shows a laminate, b shows an electrolytic copper foil, c shows an electroless copper plating layer, d shows a panel electrolytic plating layer, e shows a hole, f shows a plating resist, g shows a pattern formed by pattern plating, h shows a space portion formed by removing a thin copper foil layer by etching, i shows an undercut portion caused by etching, j shows a fine pattern formed by a general etching, k shows a fine pattern formed by an additive process, l shows a UV light beam, m shows a positive type plating resist, n shows a positive type plating resist left by development, o shows a copper pattern formed by flash etching, p shows a space portion formed by removing all thin metal layers by etching twice, q shows a negative type plating resist, r shows a negative type film for exposure, s shows a negative film left by development, t shows a nickel metal layer, u shows a pattern formed by etching only copper layers, and v shows a fine pattern finally obtained by etching a nickel metal layer.

The present invention provides a process for the production of a high-density printed wiring board having a fine pattern having a line/space=40/40 μm or less, furthermore 20/20 μm or less, by using a copper-clad board obtained by laminating a general thin copper foil having a thickness of 5 μm or less.

Each step of the production process of the present invention 1 will be explained hereinafter.

(1) First, there is produced an ultrathin-copper-foil-clad board having general electrolytic copper foils having a thickness of 5 μm as outermost layers and having at least two copper foil layers. A through hole and/or a blind via hole are formed in the copper-clad board by a generally known method.

The method of producing the above ultrathin-copper-foil-clad board having an outermost copper foil thickness of 5 μm or less is not specially limited. There may be adopted a known method. For example, the method includes a method in which a laminate formation is carried out by using protective-metal-plate-reinforced thin copper foils, and the protective metal plates are removed to form a copper-clad board, and a method in which copper foils having a thickness of more than 5 μm are used for a laminate formation to obtain a copper-clad board, and the copper foils of the board are etched and removed to a thickness of 5 μm or less before the formation of a hole; or a hole is made in the above copper-clad board with a carbon dioxide gas laser as shown in JP-A-11-220243 and JP-A-11-346059, then copper foil burrs occurring around the hole are removed by etching and at the same time the copper foils are partially removed in a thickness direction by etching so as to have a remaining copper foil thickness of 5 µm or less each. The surface of the copper-clad board having a hole made therein is plated by electroless copper plating to form an electroless plating layer having a thickness of 0.1 to 1 µm. The above "surface" of the copper-clad board includes the inside of the hole.

(2) Then, an electrolytic copper plating layer having a thickness of 0.5 to 3 µm is formed by using the deposited layer of the electroless copper plating as an electrode. The kind of the copper plating is not specially limited. For example, there may be used a copper sulfate plating, a copper pyrophosphate plating and the like.

(3) A plating resist layer for pattern electrolytic copper plating is formed on a necessary portion of the deposited layer of the copper plating. This step is also carried out by a generally known method.

(4) A pattern copper plating layer having a thickness of 6 to 30 µm is formed on the copper surface in a portion where the plating resist layer is not formed, by electrolytic copper plating. For improving the reliability of the inside of the hole, the thickness of the pattern copper plating layer is preferably 10 to 20 µm.

(5) The plating resist is removed.

(6) The entire surface is etched to dissolve and remove the thin electrolytic copper layer, the electroless copper layer and the ultrathin copper foil layer in at least a portion where the pattern copper plating layer is not formed until an insulating material is bared, whereby an ultrafine pattern is formed and a printed wiring board is completed. Owing to the formation of the fine pattern in this step, there can be produced a printed wiring board which is almost free from the occurrence of undercut as compared with a general method and has a pattern having an excellent form and which is excellent in reliability.

The copper-clad board suitably used in the present invention refers to a thermosetting resin copper-clad board having at least two copper layers. The thermosetting resin copper-clad laminate includes a known thermosetting copper-clad laminate containing an inorganic or organic base material, a multilayer copper-clad board thereof, a multilayer copper-clad board having a generally known structure such as a multilayer board having a resin-attached copper foil sheet as an external layer, and a copper-clad board containing a base material such as a polyimide film or a polyparabanic acid film.

A base material-reinforced copper-clad laminate is prepared by impregnating a reinforcing base material with a thermosetting resin composition, drying the composition to obtain a B-stage prepreg, then stacking a predetermined number of the thus-obtained B-stage prepregs, placing protective-metal-plate-reinforced copper foils on the outer surfaces of the stacked prepregs, and laminate-forming the resultant set under heat and pressure, to obtain a double-side copper-clad laminate. The method for producing the multilayer board includes a production method in which the copper foils of the above double-side copper-clad laminate are processed to form circuits, a production method in which the copper foil surfaces of the double-side copper-clad laminate are treated to prepare an internal board, prepregs and B-stage resin sheets are placed on both the surfaces of the internal board, one prepreg and one B-stage resin sheet on each surface, protective-metal-plate-reinforced thin copper foils are placed on both the surfaces of the resultant board and the resultant set is laminate-formed, and a production method in which B-stage resin sheets with protective-metal-plate-reinforced thin copper foils are disposed on both the surfaces of the same internal board as that obtained above and the resultant set is laminate-formed.

The base material is selected from generally known organic or inorganic woven fabrics or non-woven fabrics. Specifically, an inorganic fiber includes fibers of E glass, S glass, D glass and M glass. An organic fiber includes known fibers such as a wholly aromatic polyamide fiber and a liquid crystal polyester fiber. These may be interwoven fabrics. Further, there may be used a film base material.

The resin for the thermosetting resin composition for use in the present invention is selected from generally known thermosetting resins. Specific examples thereof include an epoxy resin, a polyfunctional cyanate ester resin, a polyfunctional maleimide-cyanate ester resin, a polyfunctional maleimide resin and an unsaturated-group-containing polyphenylene ether resin. These resins are used alone or in combination. In view of the form of a through hole made by irradiation with a high output carbon dioxide gas laser, a thermosetting resin composition having a glass transition temperature of at least 150° C. is preferred. In view of humidity resistance, anti-migration properties and electric characteristics after water absorption, a polyfunctional cyanate ester resin composition is preferred.

When a through hole and/or a blind via hole is/are made with a carbon dioxide gas laser, in addition to the methods disclosed in JP-A-11-220243 and JP-A-11-346059, there may be adopted a method in which a copper foil having a shiny surface having a metal or alloy treatment of nickel or cobalt or an alloy thereof is used, and a hole is made by directly irradiating the copper foil surface with a carbon dioxide gas laser, and a method in which a general copper foil surface is treated to form black copper oxide or treated with a chemical and a hole is made by directly irradiating the thus-treated copper foil with a carbon dioxide gas laser.

The copper foil which is bonded to a protective metal plate, used in the present invention, is selected from generally known copper foils. The thickness of the copper foil is 5 µm or less, preferably 3 to 5 µm. For example, there is used a copper foil having a non-treated shiny surface or a copper foil having a shiny surface having a metal or alloy treatment of nickel or cobalt or an alloy thereof. When a copper foil treated with metal is used, the copper foil is laminated to a surface, a protective metal plate as an external layer is removed and then the resultant copper foil surface is directly irradiated with a carbon dioxide gas laser at a relatively low energy of 5 to 20 mJ to make a hole.

When a through hole is made, there may be adopted a method in which a general copper foil having a thickness of more than 5 µm is used as an external layer to prepare a copper-clad board, the copper foil as an external layer is dissolved with a chemical to decrease the thickness of the copper foil to 5 µm or less, and then the resultant copper foil is directly irradiated with a carbon dioxide gas laser to make the through hole. Further, there may be adopted a method in which the through hole is made with a metal drill having a size of 100 to 150 µm.

When a through hole and/or a blind via hole are made in a thick copper foil by irradiation with a carbon dioxide gas laser by means of its pulse oscillation at an output energy of 5 to 60 mJ, burrs occur around the hole. For this reason, after the irradiation with the carbon dioxide gas laser, both copper foil surfaces are flatly etched in a thickness direction preferably with a chemical to partially remove the thickness of each of the copper foils. By the above etching, the burrs are removed at the same time. The thus-obtained thinned copper foils are suitable for forming fine patterns thereon, and the copper foil around the through hole remains on each surface, which is suitable for a high-density printed wiring board. In this case, etching is more preferable than mechanical polishing in view of the removal of burrs in the hole portion and a dimensional change due to the polishing.

In the present invention, the method of removing the copper burrs occurring in the hole portion is not specially limited. For example, there can be employed a method of dissolving and removing a metal surface with a chemical (called "SUEP method") disclosed in JP-A-02-22887, JP-A-02-22896, JP-A-02-25089, JP-A-02-25090, JP-A-02-59337, JP-A-02-60189, JP-A-02-166789, JP-A-03-25995, JP-A-03-60183, JP-A-03-94491, JP-A-04-199592 and JP-A-04-263488. The etching is carried out at a rate of 0.02 to 1.0 μm/second.

A carbon dioxide gas laser generally uses a wavelength of 9.3 to 10.6 μm in an infrared wavelength region. Copper foil is processed by pulse oscillation at an energy of 5 to 60 mJ, preferably 7 to 45 mJ, to make holes. The energy is selected depending upon the treatment on the copper foil as an external layer and the thickness of the copper foil as required. Of course, an excimer laser and a YAG laser may be used for forming a hole.

A UV laser such as an excimer laser and a Nd-YAG laser may be used for forming a hole. A UV laser makes a hole by irradiation of a laser beam having a UV wavelength. The wavelength is not specially limited, while a wavelength of 200 to 400 nm or 1.06 μm is generally used. In particular, a solid-state UV laser is used. A solid-state UV laser carries out processing by a mechanism which cut off a molecular bond constituting an organic substance with the minimum influence of heat upon the organic substance. A solid-state UV laser generates less carbon in a hole than the carbon dioxide laser, so that the inside of the hole is clean. Therefore, a copper plating to follow can adhere to the inside of the hole with a high degree of reliability without any special pre-treatment. Since a UV laser wavelength is short, copper absorbs it. Therefore, it is possible to make a hole in a copper foil and further make a hole in an insulation layer by irradiating a copper foil surface with the laser without using an auxiliary material for making a hole.

After the entire surface is plated by electrolytic copper plating lastly, etching is carried out until thin copper foil portions are removed and the base material is bared in these portions, whereby a pattern is formed. An etchant used for the etching is not specially limited. There may be used a generally known method such as the SUEP method described before or a method using a ferric chloride solution, a copper chloride solution or an ammonium persulfate solution. Preferred is the SUEP method.

According to the present invention 2, further, there is provided a process for the production of a high-density printed wiring board, in which the plating resist layer formed in the step (3) described before is a positive type resist layer and the step (3) further comprises, after the positive type plating resist layer is formed, carrying out exposure to a UV laser beam and then dissolving and removing those portions of the positive type plating resist layer which have been exposed to the UV laser beam.

Concerning a method of producing a printed wiring board having a fine pattern, particularly a fine pattern having a line/space=20/20 μm or less, by using a plating resist for the formation of a pattern, the present invention 2 uses a positive type resist as a pattern plating resist to form a pattern. In comparison with a case using a negative resist, the occurrence of defective patterns becomes smaller and there can be produced a high-density printed wiring board which is excellent in the location accuracy of a pattern. Of course, the above positive type film maybe used in steps of the additive method.

An example of a production method using the positive type resist will be explained hereinafter. In this example, a pattern having a line/space=15/15 μm and a thickness of 20 μm is formed. The entire surface of a copper-clad board having a through hole and/or blind via hole and having thin copper coils having a thickness of 5 μm or less is plated by electroless copper plating to form an electroless copper plating layer having a thickness of 0.1 to 1 μm. In this case, the entire surface includes the inside of the hole. Then, an electrolytic copper plating layer having a thickness of 0.5 to 3 μm is formed. Then, a positive type plating resist layer having a thickness of 25 μm is formed. The positive type plating resist layer is directly exposed to an UV laser beam to form a positive type plating resist portion having a width of 25 μm for line and a positive type plating resist portion having a width of 5 μm for space. Then, the above positive type plating resist portion having a width of 25 μm for line is dissolved and removed, to prepare a substrate on which the positive plating resist layer part having a width of 5 μm for space remains. Electrolytic copper plating is deposited on the portion having a width of 25 μm for line to form an electrolytic copper plating layer having a thickness of approximately 25 μm. Then, the positive type plating resist is removed. Then, the substrate is entirely etched by flash etching to form a pattern having a line/space=15/15 μm and having a thickness of 20 μm. The limitation of a pattern width is approximately 10 μm for retaining adhesive strength. A width smaller than the above limitation is undesirable.

In the above production steps of the high-density printed wiring board, it is important to use the positive type plating resist as a plating resist for forming an ultrafine pattern. When a negative type plating resist is used, the exposure and development of the resist for forming a width of 5 μm for space are very difficult in the above formation of a width of 25 μm for line/a width of 5 μm for space. As a base material, there may be used a generally known base material such as a thin-copper-foil-clad board, a polyimide film copper-clad board or a substrate for additive. Especially when a printed wiring board is produced by using a thin-copper-foil-clad board and carrying out the following steps, there can be obtained a high-density printed wiring board having an ultrafine pattern in an excellent form and having excellent copper foil adhesive strength.

That is, the present invention 2 provides a process for the production of a high-density printed wiring board, which process comprises the following steps of (1) providing an ultrathin-copper-foil-clad board having a through hole and/or a blind via hole formed therein and having an outermost copper foil thickness of 5 μm or less, plating the surface thereof including the inside of the hole by electroless copper plating to form an electroless copper plating layer having a thickness of 0.1 to 1 μm, (2) forming an electrolytic copper plating layer having a thickness of 0.5 to 3 μm by using the electroless copper plating deposited layer as an electrode, (3) forming a positive type plating resist layer for pattern electrolytic plating on a necessary portion of the electrolytic copper plating deposited layer, carrying out UV exposure, dissolving and removing UV-exposed portions of the positive type plating resist layer, (4) forming a pattern copper plating layer having a thickness of 6 to 30 μm, preferably 10 to 20 μm, on the copper surface in a portion where the plating resist layer is not formed, by electrolytic copper plating, (5) removing the plating resist layer, and (6) etching the entire surface by flash etching to dissolve and remove the thin electrolytic copper layer, the electroless copper layer and the ultrathin copper foil layer in at least a portion where the pattern copper plating layer is not formed, whereby an ultrathin pattern is formed and a printed wiring board is completed.

The positive type resist can be selected from generally known positive type resists. Examples thereof includes a resist containing an acrylic ester resin having an adamantane structure in an ester part (JP-A-4-39665), a resist containing an acrylic or methacrylic acid ester resin having a terpenoid structure (JP-A-8-82925), a resist containing a copolymer containing units derived from an acrylic ester or a methacrylic ester of hydroxybicyclo[3,1,1]neptanone or its lower alkyl substitution product (JP-A-10-115925), etc. Each of these positive type resists contains at least an alkali-soluble resin and an acid generator. Further, each of these positive type resists may contain a known different resin, a known plasticizer, a known stabilizer, a known colorant, and a known surfactant.

When used, the positive type resist is dissolved in a solvent in which it is soluble. Otherwise, the positive type resist is applied to a film, a solvent is removed to form a sheet and the sheet is used. The positive type resist is applied to a thin copper-clad board to form a layer having a predetermined thickness, and the resist layer is exposed to generally a UV laser having a wavelength of 190 to 400 nm and then heated. Then, the resist layer is developed with a developing solution such as an alkaline aqueous solution, e.g., a 0.1 to 10% by weight tetramethylammonium hydroxide aqueous solution or a sodium carbonate aqueous solution. In this case, a photo-acid generator in a portion which has been exposed to the UV laser decomposes to generate an acid and, because of the heating after the exposure, the catalytic reaction of the generated acid causes a breakage in a crosslinking portion, whereby the exposed portion becomes alkali-soluble. When a UV laser is used for the positive type resist, a fine pattern excellent in pattern location accuracy is formed.

An electrolytic copper plating layer having a thickness of 6 to 30 μm is formed in a portion where the resist is removed by the above development with an alkaline aqueous solution and the copper foil is bared. Then, the positive type resist is removed and then flash etching is entirely carried out to dissolve the copper foils to form patterns having a predetermined width.

The present invention 3 is directed to a process for producing a high-density printed wiring board having a fine pattern having a line/space=40/40 μm or less, furthermore 25/25 μm or less, by providing an electrolytic copper foil of which one surface has a roughness, forming a 0.1 to 5 μm thick layer of nickel and/or cobalt or an alloy of nickel and/or cobalt on the above one surface, disposing the so-prepared electrolytic copper foils such that the copper foil surfaces thereof become outermost layers, to prepare a double-side copper-clad board or a multilayer double-side copper-clad board, removing the copper layers as the external layers by etching to leave the nickel and/or cobalt layers or the alloy layers, and then using the nickel and/or cobalt layers or the alloy layers. According to the present invention 3, there can be produced a printed wiring board which has an ultrafine pattern having an excellent form and which is excellent in adhesive strength. Steps of the present invention 3 will be explained hereinafter.

(1) A laminate formation is carried out by using electrolytic copper foils each obtained by forming a roughness on one surface of a copper foil and forming a 0.1 to 5 μm thick layer of nickel and/or cobalt or an alloy thereof on the one surface such that the electrolytic copper foils become the outermost layers, whereby there is produced a double-side copper-clad board or a multilayer double-side copper-clad board having at least two copper layers. A penetration hole and/or a blind via hole is/are made in the copper-clad board by a generally known method. Of course, the formation of a hole can be carried out after the electrolytic copper foils as the external layers are removed by etching.

The electrolytic copper foils each of which has a roughness on one surface and has a 0.1 to 5 μm thick layer of nickel and/or cobalt or an alloy thereof on the one surface are disposed as outermost layers and these are laminate-formed under heat under pressure preferably in vacuum, to produce a double-side copper-clad board or a multilayer double-side copper-clad board.

The electrolytic copper foils as the external layers of the double-side copper-clad board or the multilayer double-side copper-clad board are removed by etching the entire surface with a chemical which hardly dissolve the layers of nickel and/or cobalt or an alloy thereof, to bare the 0.1 to 5 μm thick layers of nickel and/or cobalt or an alloy thereof. Then, a penetration hole and/or a blind via hole are made with a laser or a mechanical drill. Otherwise, a penetration hole and/or a blind via hole are made while retaining the electrolytic copper foils and then only the electrolytic copper foils as the external layers are removed by etching to obtain a double-side board having the 1 to 5 μm thick layers of nickel and/or cobalt or an alloy thereof left as the external layers.

(2) Then, the surface of the double-side board having the hole made therein, which surface includes the inside of the hole, is plated by electroless copper plating to form an electroless copper plating layer of 0.1 to 1 μm.

(3) Then, an electrolytic copper plating layer having a thickness of 0.5 to 3 μm is formed by using the thus-obtained electroless copper plating deposited layer as an electrode. The kind of the copper plating is not specially limited. For example, there may be used a copper sulfate plating, a copper pyrophosphate plating and the like.

(4) A plating resist layer for pattern electrolytic copper plating is formed on a necessary portion of the copper plating deposited layer. This step is also carried out by a generally known method.

(5) A pattern copper plating layer having a thickness of 6 to 30 μm is formed on the copper surface in a portion where the plating resist layer is not formed, by electrolytic copper plating.

(6) The plating resist is removed.

(7) The entire surface is etched with a chemical which hardly dissolves the layers of nickel and/or cobalt or an alloy thereof to dissolve and remove the thin electrolytic copper layer and the electroless copper layer in at least a portion where the pattern copper plating layer is not formed and to leave the layers of nickel and/or cobalt or an alloy thereof, (8) Then, the entire surface is etched with a chemical which hardly dissolves copper to dissolve and remove the layers of nickel and/or cobalt or an alloy thereof, whereby an ultrafine pattern is produced. Owing to the above steps, there is produced a printed wiring board which has an ultrafine pattern having an excellent form and which is excellent in adhesive strength.

Since the ultrafine pattern is formed by the above steps, almost no undercut occur when compared with a case using a general method so that a pattern having excellent form is formed and a printed wiring board excellent in reliability is produced. The chemical which selectively etches and removes only copper and which hardly dissolve nickel metal, cobalt metal or an alloy thereof can be selected from generally known chemicals. There is preferably used an alkaline etchant whose rate of dissolving nickel metal or the like is slow.

Further, the chemical whose etching rate of nickel metal, cobalt metal or an alloy thereof is fast and whose etching rate of copper is slow, can be selected from generally known chemicals. Examples of the above chemical include a chemical mainly formed of sulfuric acid/hydrogen peroxide/additive and a chemical mainly formed of ammonium fluoride/hydrogen peroxide/additive. Commercially available examples include Pewtax (trade name, supplied by Mitsubishi Gas Chemical Company, Inc.) and MELSTRIP N-950 (trade name, supplied by Meltex Inc.).

A base material-reinforced copper-clad laminate used in the present invention 3 is produced as follows. First, a reinforcing base material is impregnated with a thermosetting resin composition and the impregnated composition is dried to obtain a B-stage prepreg. Then, a predetermined number of the thus-obtained B-stage prepregs are stacked. Electrolytic copper foils each prepared by forming a roughness on one surface thereof and forming a 0.1 to 5 μm thick layer of nickel and/or cobalt or an alloy thereof on the above one surface are disposed as outermost layers on both surfaces of the stacked prepregs, one electrolytic copper foil on each surface. The resultant set is laminate-formed under heat under pressure preferably in vacuum, to obtain a double-side copper-clad laminate. The multilayer board is produced as follows. A known double-side copper-clad laminate having electrolytic copper foils as both external layers is provided, the copper foils of the double-side copper-clad board are processed to form patterns thereon, and the copper foil surfaces are chemically treated as required, to prepare an internal board. Then, prepregs, B-stage resin sheets and the like are disposed on the outer surfaces of the internal board, electrolytic copper foils each prepared by forming a roughness on one surface thereof and forming a 0.1 to 5 μm thick layer of nickel and/or cobalt or an alloy thereof on the above one surface are disposed on both the surface of the resultant board, and the resultant set is similarly laminate-formed under heat under pressure and preferably in vacuum. Otherwise, a B-stage resin sheet is attached to a mat surface of an electrolytic copper foil obtained by forming a roughness on one surface of copper foil and forming a 0.1 to 5 μm thick layer of nickel and/or cobalt or an alloy thereof on the above one surface, to obtain a resin-sheet-attached copper foil, the resin-sheet-attached copper foils are disposed both the surfaces of the internal board, one on each surface, and the resultant set is laminate-formed to prepare a multilayer copper-clad board. According to the above methods or the like, there is produced a generally known copper-clad multilayer board.

In the present invention 3, when a penetration hole and/or a blind via hole is/are made with a carbon dioxide gas laser, there can be employed a method disclosed in JP-A-11-220243 and JP-A-11-346059 and a method in which an electrolytic copper foil surface which has been treated to form black copper oxide or treated with a chemical is directly irradiated with a carbon dioxide gas laser to make a hole. Then, the electrolytic copper foils as the external layers are removed by etching. Otherwise, first, the electrolytic copper foils are removed by etching to bare the thin metal or alloy treatment layer of nickel and/or cobalt or an alloy thereof and then the bared treatment-layer is directly irradiated with a carbon dioxide gas laser to form the hole. However, in view of the occurrence of burrs in a hole portion, the latter is preferred. Furthermore, a hole can be made with a UV-YAG laser. A penetration hole having a diameter of 100 μm or more is generally made with a mechanical drill by a known method.

The method of forming the metal or alloy treatment layer of nickel and/or cobalt or an alloy thereof on a mat surface of the electrolytic copper foil which surface has a roughness, used in the present invention 3, can be selected from generally known methods. The size of the roughness is not specially limited. In view of the formation of a fine pattern, the size of the roughness is preferably 1 to 3 μm. The shiny surface of the copper foil can be treated by a generally known treatment. For example, there may be used a copper foil having a shiny surface which has no surface roughness and is treated by a rust-proofing treatment or a copper foil having a shiny surface to which a layer of nickel and/or cobalt or an alloy thereof is attached.

The present invention 4 is characterized by the use of a double-side copper-clad board or a multilayer double-side copper-clad board which is produced by disposing, as each outermost layer, a copper foil sheet-attached metal foil prepared by forming a 0.1 to 3 μm thick layer of nickel and/or cobalt or an alloy thereof on one surface of a copper foil sheet and further forming a 0.5 to 5 μm thick roughness on the above-obtained treatment layer with nickel and/or cobalt or an alloy thereof. That is, the present invention 4 is directed to a method of producing a high-density printed wiring board, in which the copper foil sheets disposed as the outermost layers are removed to leave the layers of nickel and/or cobalt or an alloy thereof and the above layers are used to produce a high-density printed wiring board having a line/space=40/40 μm or less, furthermore 25/25 μm or less. The present invention 4 will be explained hereinafter.

(1) First, a 0.1 to 3 μm thick layer of nickel and/or cobalt or an alloy thereof is formed on one surface of a copper foil sheet and a 0.5 to 5 μm thick roughness is formed thereon by further forming a layer of nickel and/or cobalt or an alloy thereof, to obtain a copper-foil-attached metal foil. A double-side copper-clad board or a multilayer double-side copper-clad board is produced by using the thus-obtained copper-foil-attached metal foils as outermost layers. The protective copper foil sheets as the outermost layers are removed and then, a penetration hole and/or a blind via hole is/are made in the above copper-clad board by a generally known method. Of course, the hole can be made after the removal of the copper foil sheets as the external layers, and it is also possible to make the hole while retaining the copper foil sheets and then remove the copper foil sheets.

The copper foil sheet is not specially limited, so long as a layer of nickel and/or cobalt or an alloy of nickel and/or cobalt can be formed thereon. There is preferably used a copper foil, particularly an electrolytic copper foil. First, a thin layer of nickel and/or cobalt or an alloy thereof is formed on the copper foil sheet. The thickness of the layer is not specially limited, while it is preferably 0.1 to 3 μm. Then, a 0.5 to 5 μm thick roughness (Rz: an average roughness of 10 points) is formed thereon by further forming a layer of nickel and/or cobalt or an alloy thereof, to obtain a copper-foil-attached metal foil. The thus-obtained metal foils are disposed as outermost layers and the resultant set is laminate-formed by a known method, for example under heat under pressure preferably in vacuum, to produce a double-side copper-clad board or a multilayer double-side copper-clad board.

A penetration hole and/or a blind via hole is made in the double-side copper-clad board or the multilayer double-side copper-clad board with a laser, a mechanical drill or the like after the copper foil sheets as the external layers are removed or while the copper foils as the external layers are retained. Eventually, the copper foil sheets are removed. Steps after the above step are the same as the steps (2) to (8) of the present invention 3.

A base-material-reinforced copper-clad laminate used in the present invention 4 is produced as follows. First, a reinforcing base material is impregnated with a thermosetting resin composition and the impregnated composition is dried to obtain a B-stage prepreg. Then, a predetermined number of the thus-obtained B-stage prepregs are stacked. Copper-foil-sheet-attached metal foils each prepared by forming a roughness on one surface of a copper foil sheet with nickel and/or cobalt or an alloy thereof are disposed on both surfaces of the stacked prepregs such that the metal foil surface of each of the copper-foil-sheet-attached metal foils faces the resin side. The resultant set is laminate-formed under heat under pressure preferably in vacuum, to obtain a double-side copper-clad laminate. A multilayer board is obtained as follows. The copper foils of the above double-side board or a known double-side copper-clad laminate produced by using electrolytic copper foils as both external layers are processed to form patterns thereon, and the metal foil surfaces are chemically treated as required, to form an internal board. Prepregs, B-stage resin sheets, etc., are disposed on the outer surfaces of the internal board, the above copper foil-sheet-attached metal or alloy foils of nickel and/or cobalt or an alloy thereof are disposed on both the surfaces of the resultant internal board, and the resultant set is laminate-formed under heat under pressure preferably in vacuum. Otherwise, a B-stage resin sheet is bonded to the mat surface of the above copper-foil-sheet-attached metal foil obtained by attaching nickel and/or cobalt or an alloy thereof to one surface of a copper foil sheet, then the resultant metal foils are disposed both the surfaces of the internal board and the resultant set is laminate-formed to obtain a multilayer copper-clad board. According to generally known methods including the above methods, the double-side copper-clad multilayer board is produced.

The method of forming the metal or alloy treatment layer of nickel and/or cobalt or an alloy thereof on the copper foil sheet, preferably an electrolytic copper foil, used in the present invention 4, can be selected from generally known methods. The thickness of the metal layer or the alloy layer is 0.1 to 3 μm, preferably 0.5 to 2 μm. The size of the roughness formed on the metal layer or the alloy layer is not specially limited, while it is preferably 0.5 to 5 μm as an average roughness (RZ), more preferably 1 to 4 μm, in view of the formation of a fine pattern. The surface of the copper foil sheet opposite to the surface on which the metal or alloy layer of nickel and/or cobalt or an alloy thereof is to be formed, can be treated by a known treatment. Examples thereof include a surface which has no surface roughness and is treated by a rust-proofing treatment and a surface to which a metal or alloy layer of nickel and/or cobalt or an alloy thereof is attached.

EFFECT OF THE INVENTION

According to the production process of the present invention 1, concerning a method of producing an ultrafine pattern in a copper-clad board having a through hole and/or a blind via hole and having at least two thin copper layers as outer layers, thin copper layers are plated by electroless copper plating layer and electrolytic copper plating, a plating resist layer is formed thereon, then a pattern copper plating is carried out, the plating resist is removed, and then the thin electrolytic copper layer, the electroless copper layer and the thin copper layers are removed by etching. Owing to this, there is provided a process for the production of a high-density printed wiring board having a pattern which is almost free from undercut and has excellent form.

Further, according to the production process of the present invention 2, concerning a method of producing an ultrafine pattern by a flash etching method, a positive type plating resist is used as a resist. Owing to this, there is provided a process for the production of a high-density printed wiring board having an ultrafine pattern which is almost free from undercut and has excellent form.

According to the production process of the present invention 3, a copper foil obtained by attaching a 0.1 to 5 μm thick layer of nickel and/or cobalt or an alloy thereof to a rough mat surface of an electrolytic copper foil is used as a copper foil, the copper foils are disposed as outermost layers, only the electrolytic copper foil parts as the external layers are selectively removed by etching, the remaining metal or alloy layers of nickel and/or cobalt or an alloy thereof are plated by a thin electroless copper plating and an electrolytic copper plating, then a pattern plating resist is formed thereon, a pattern electrolytic copper plating is carried out, the plating resist is removed, then the entire surface is etched with a chemical having excellent copper solubility and having low solubility of nickel metal, etc., to dissolve and remove the thin electrolytic copper layer and the electroless copper layer and to bare the layer of nickel metal, etc., and then etching is carried out with a chemical having excellent solubility of nickel metal, etc., and low copper solubility. Accordingly, there is provided a process for the production of a high-density printed wiring board which is almost free from undercut and has excellent form and which has excellent copper adhesion.

According to the production process of the present invention 4, there is used a double-side copper-clad board or a multilayer double-side copper-clad board which is produced by using, at least as each outermost layer, a copper foil sheet-attached metal foil prepared by forming a 0.1 to 3 μm thick layer of nickel, etc., on one surface of a copper foil sheet and forming a 0.5 to 5 μm thick roughness thereon by further forming a layer of nickel, etc., and there is therefore provided a process for the production of a high-density printed wiring board which is almost free from undercut and has excellent form and which has excellent copper adhesion.

EXAMPLES

The present invention will be concretely explained with reference to Examples and Comparative Examples. In Examples and Comparative Examples, "part" stands for "part by weight", unless otherwise specified.

Example 1

900 Parts of 2,2-bis(4-cyanatophenyl)propane and 1,000 parts of bis(4-maleimidephenyl)methane were melted at 150° C. and allowed to react for 4 hours with stirring, to prepare a prepolymer. The prepolymer was dissolved in mixed solvents of methyl ethyl ketone and dimethylformamide. To this solution were added 400 parts of a bisphenol A type epoxy resin (trade name: Epikote 1001, supplied by Japan Epoxy Resins Co., Ltd) and 600 parts of a cresol novolak type epoxy resin (trade name: ESCN-220F, supplied by Sumitomo Chemical Co., Ltd.), and these materials were homogeneously dissolved and mixed. Further, as a catalyst, 0.4 part of zinc octylate was added, and these materials were dissolved and mixed. To the resultant mixture was added 2,000 parts of an inorganic filler (trade name: Calcined Talc, supplied by Nippon Talc K.K.), and these materials were homogeneously stirred and mixed to prepare a varnish. A glass woven fabric having a thickness of 100 μm was impregnated with the above varnish, and the impregnated glass woven fabric was dried at 150° C. to prepare prepreg having a gelation time of 120 seconds at 170° C. and having a resin composition content of 45% by weight. Four sheets of the prepreg were stacked, 12 μm thick general electrolytic copper foils were placed on the upper and lower surfaces of the stacked prepregs, one electrolytic copper foil on each surface, and the resultant set was laminate-formed at 200° C. at 20 kgf/cm$^2$ under a vacuum of 30 mmHg or less for 2 hours, to obtain a double-side copper-clad laminate having an insulation layer thickness of 400 μm.

Separately, 800 Parts of a copper powder having an average particle diameter of 0.8 μm was added as a metal powder to a varnish prepared by dissolving a polyvinyl alcohol powder in water, and these materials were homogeneously stirred and mixed. The so-prepared varnish was applied to one surface of a polyethylene terephthalate film having a thickness of 25 μm to obtain a resin layer having a thickness of 60 μm, and the resin layer was dried at 110° C. for 30 minutes to prepare an auxiliary material having a metal compound content of 65% by volume. Further, the above varnish containing the copper powder was applied to one surface of a 50 μm thick aluminum to form a resin layer having a thickness of 30 μm, and the resin layer was dried to prepare a backup sheet. The auxiliary material was disposed on the upper surface of the above double-side copper-clad laminate, and the backup sheet was disposed on the lower surface of the double-side copper-clad laminate such that each of the resin layer surfaces of the auxiliary sheet and the backup sheet faced to the copper foil side. The resultant set was laminated with a roll at 100° C. at a linear pressure of 15 kgf/cm to bond the auxiliary sheet and the backup sheet to the double-side copper-clad laminate.

The upper surface of the double-side copper-clad laminate was 8 shots-irradiated directly with a carbon dioxide gas laser at a pulse energy of 30 mJ to make 900 penetration holes having a diameter of 100 μm each for through holes at intervals of 1 mm. The penetration holes for through holes were made in 70 blocks. A desmearing treatment was carried out. Then, copper foil burrs around the holes were dissolved and removed by the SUEP method and at the same time the copper foils as the external layers were dissolved until each of the copper foils had a thickness of 2 μm. The resultant board was plated by electroless copper plating to form an electroless copper plating layer having a thickness of 0.4 μm. Then, the board was plated by electrolytic copper plating to form a copper layer having a thickness of 1 μm (FIG. 1(1)). A 15 μm thick resist layer for a pattern electrolytic copper plating was formed on necessary portions of the above-obtained copper plating deposited layer (FIG. 1(2)). A pattern copper plating layer having a thickness of 15 μm was formed on the copper surface in portions where the plating resist layer was not formed, by electrolytic copper plating (FIG. 1(3)). The plating resist was removed. Then, etching was entirely carried out with a SUEP solution (FIG. 1(4)) to form a pattern having a line/space=25/25 μm. The cross section of the pattern had no undercut caused by the etching and had a good form (FIG. 1(5) $g,h$). Table 1 shows the evaluation results of the printed wiring board.

Example 2

700 parts of an epoxy resin (trade name: Epikote 5045, supplied by Japan Epoxy Resins Co., Ltd), 300 parts of an epoxy resin (trade name: ESCN220F), 35 parts of dicyandiamide and 1 part of 2-ethyl-4-methylimidazole were dissolved in mixed solvents of methyl ethyl ketone and dimethylformamide. 800 parts of the same calcined talc as that used in Example 1 was added to this solution, and these materials were homogeneously dispersed by forcedly stirring to prepare a varnish. A glass woven fabric having a thickness of 100 μm was impregnated with the above varnish, and the impregnated glass woven fabric was dried to prepare prepreg (prepreg A) having a gelation time of 150 seconds and having a resin composition content of 45% by weight. Further, a glass woven fabric having a thickness of 50 μm was impregnated with the above varnish, and the impregnated glass woven fabric was dried to prepare prepreg (prepreg B) having a gelation time of 178 seconds and having a resin composition content of 70% by weight. Two sheets of the prepreg A were stacked, 12 μm thick general electrolytic copper foils were placed on the upper and lower surfaces of the stacked prepreg sheets, one on each surface, and the resultant set was laminate-formed at 190° C. at 20 kgf/cm$^2$ under a vacuum of 30 mmHg or less for 2 hours, to obtain a double-side copper-clad laminate.

Patterns were formed on both the surfaces of the double-side copper-clad laminate, and both the surfaces were treated to form black copper oxide. Sheets of the prepreg B were placed on both the surfaces, one on each surface. Copper foils (trade name: F3B-WS copper foil, supplied by Circuit Foil Japan Co., Ltd.) prepared by treating a shiny surface of a 3 μm thick general electrolytic copper foil with a cobalt alloy and then bonding a 35 μm thick copper plate to the treated shiny surface for protective reinforcement, were disposed thereon, one on each surface, and the resultant set was similarly laminate-formed to produce a four-layered board.

The metal plates for protection were removed from both the surfaces of the four-layered board. Each of the copper foil surfaces on both the surfaces was 1 shot irradiated with a carbon dioxide gas laser at a pulse energy of 10 mJ, to make blind via holes having a diameter of 100 μm each in both the surfaces. The four-layered board was placed in a plasma device and a remaining resin in the bottom of each blind via hole was removed. The cobalt alloy treatments of the external layers were dissolved and removed with a chemical such that each of the copper foils had a thickness of 1.5 μm. Then, electroless copper plating was entirely carried out to form a 0.3 μm thick electroless copper plating layer. Then, electrolytic copper plating was carried out to form a 2 μm thick electrolytic copper plating layer. Then, a 15 μm thick plating resist layer for an electrolytic copper plating was formed. A 14 μm thick electrolytic copper plating layer was formed on the copper foil in portions where the plating resist layer was not formed. The plating resist was removed. The entire surface was etched to dissolve and remove the thin electrolytic copper layer, the electroless copper layer and the ultrathin copper foil layer in a portion where the pattern copper plating layer was not formed, thereby producing a printed wiring board having a line/space=20/20 μm. Table 1 shows the evaluation results of the printed wiring board.

Comparative Example 1

Figure 2:
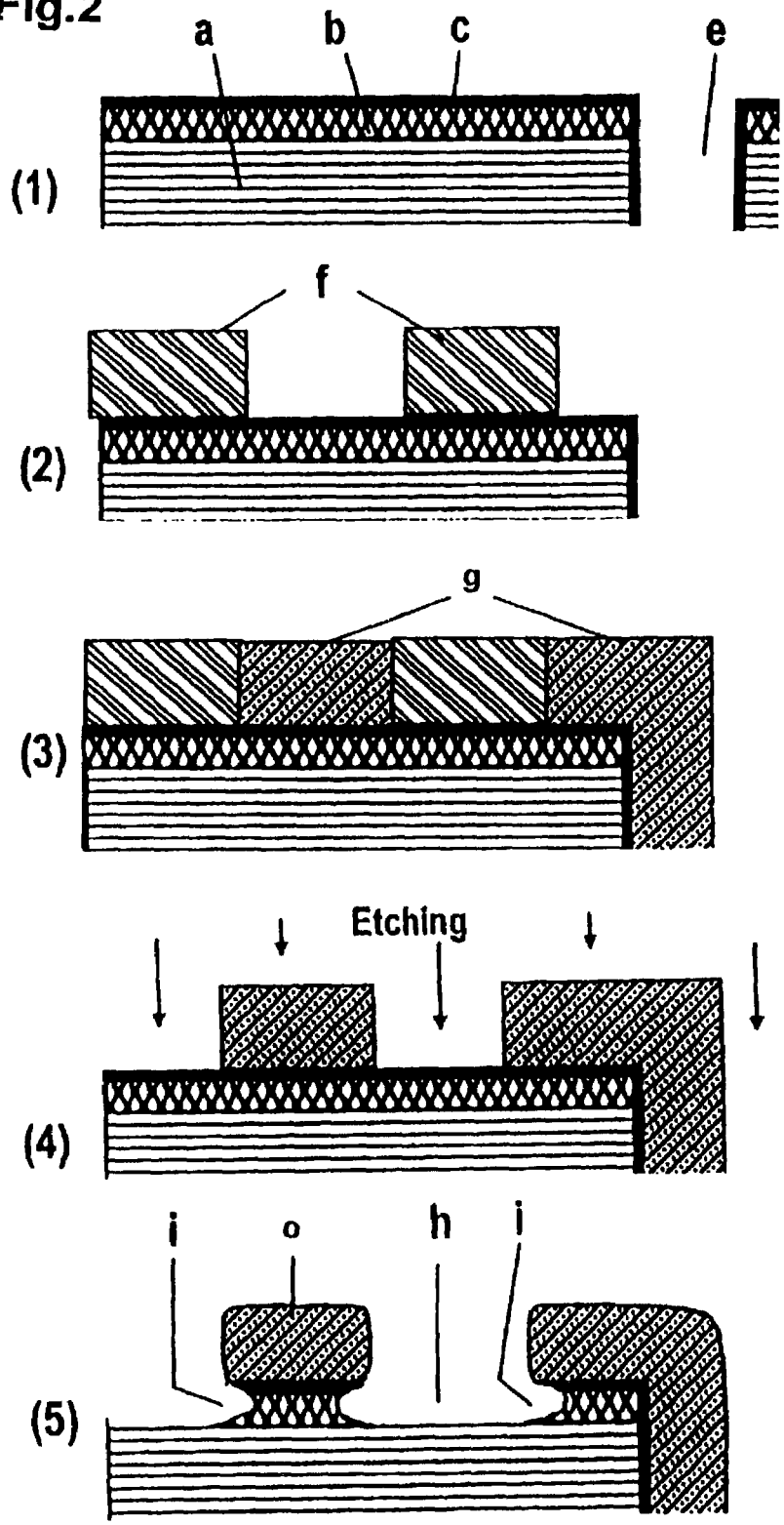
FIG. 2 is a process drawing showing steps of forming a fine pattern in Comparative Example 1.

In the production of the printed wiring board in Example 1, copper plating was carried out by only electroless copper plating without carrying out the following electrolytic copper plating (FIG. 2(1)), a panel electrolytic copper plating layer was directly formed on the electroless copper plating layer (FIG. 2(2), (3)), etching was similarly carried out to etch and remove the thin electroless copper layer and the ultrathin copper foil layer in portions where the pattern copper plating layer was not formed, thereby producing a printed wiring board (FIG. 2(5)). In this case, the lower side of the pattern had an undercut (i) of 5.4 μm at each side. Table 1 shows the results of evaluations.

Comparative Example 2

Figure 3:
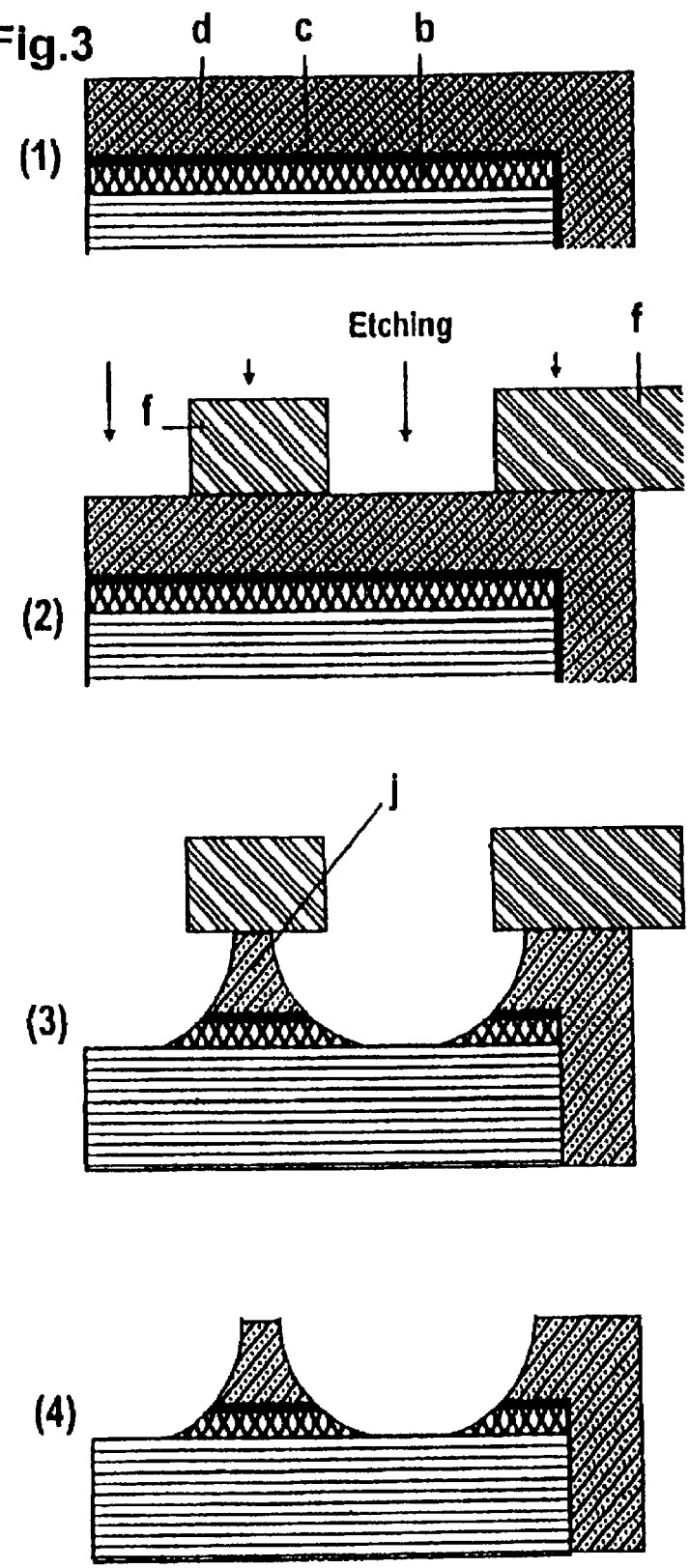
FIG. 3 is a process drawing showing steps of forming a fine pattern in Comparative Example 2.

A four-layered copper-clad laminate was obtained in the same manner as in Example 2 except that the metal-plate-attached copper foils used as the external layers of the four-layered copper-clad laminate in Example 2 were replaced with 12 μm thick general electrolytic copper foils. The electrolytic copper foils were etched until each of the electrolytic copper foils had an average thickness of 3 μm, whereby a roughness of 1 μm was formed on each surface. The resultant four-layered copper-clad laminate was placed on an XY table. Each surface of the copper-clad board was 2 shots irradiated with a carbon gas laser at a pulse energy of 12 mJ to make blind via holes. After a plasma treatment was similarly carried out, a 0.3 μm thick electroless copper plating layer was formed and then a 14 μm thick electrolytic copper plating layer was formed thereon (FIG. 3(1)). A 20 μm thick etching resist layer was formed thereon (FIG. 3(2)). Then, a pattern having a line/space=20/20 μm was formed (FIG. 3(3), (4)). The form thereof was triangular and it was not good. Table 1 shows the results of evaluations.

Comparative Example 3

Figure 4:
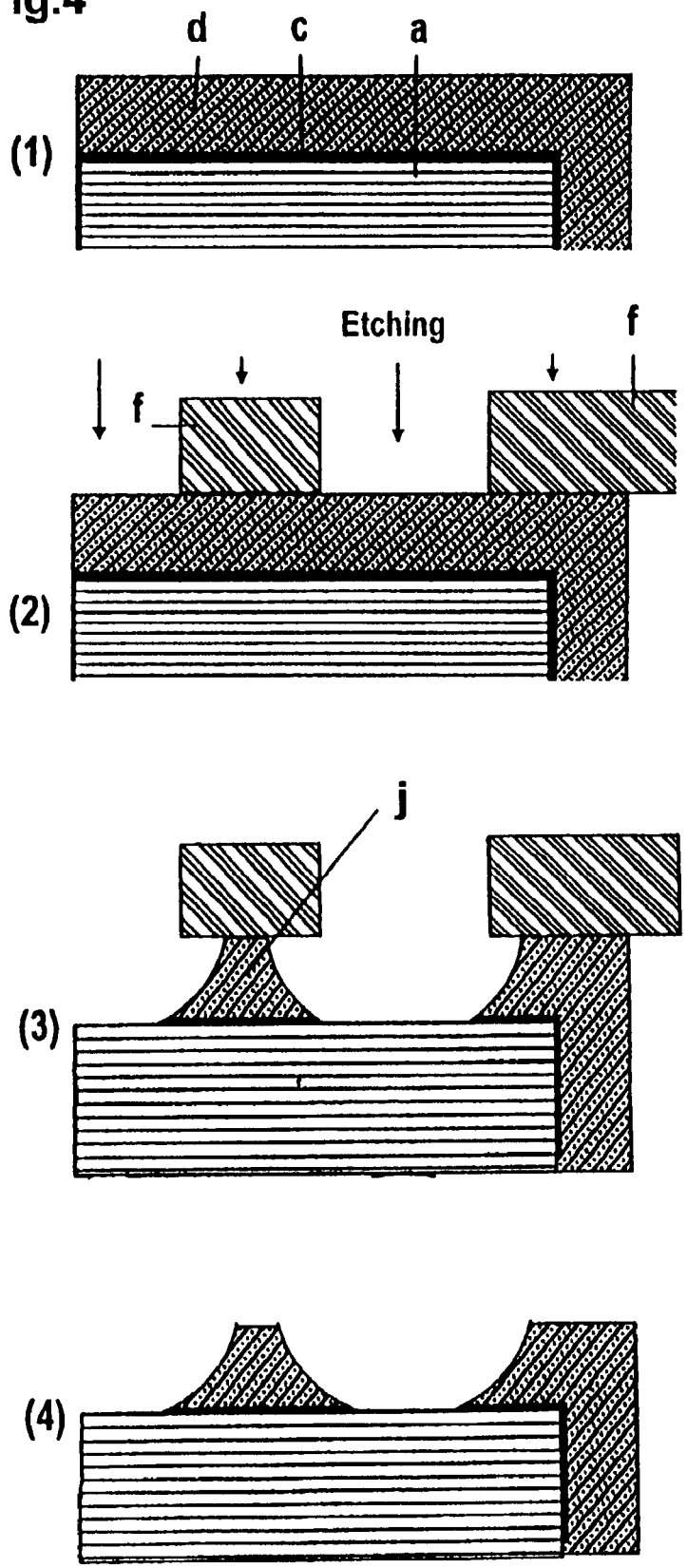
FIG. 4 is a process drawing showing steps of forming a fine pattern in Comparative Example 3.

The same copper-clad laminate as that in Example 1 was used. The copper foils as the external layers of the copper-clad laminate were removed by etching. Then, penetration holes having a diameter of 100 μm each were made in the laminate with a carbon dioxide gas laser at 15 mJ. The entire surface was treated for desmearing, plated by electroless copper plating to form a 1 μm thick electroless copper plating layer and then plated by electrolytic copper plating to form a 16 μm thick electrolytic copper plating layer thereon (FIG. 4(1)). Thereafter, a pattern having a line/space=25/25 μm was formed in the same manner as in Comparative Example 1 (FIG. 4(2), (3), (4)). The pattern had undercuts, and the form thereof was triangular and defective. Table 1 shows the results of evaluations.

Comparative Example 4

Figure 5:
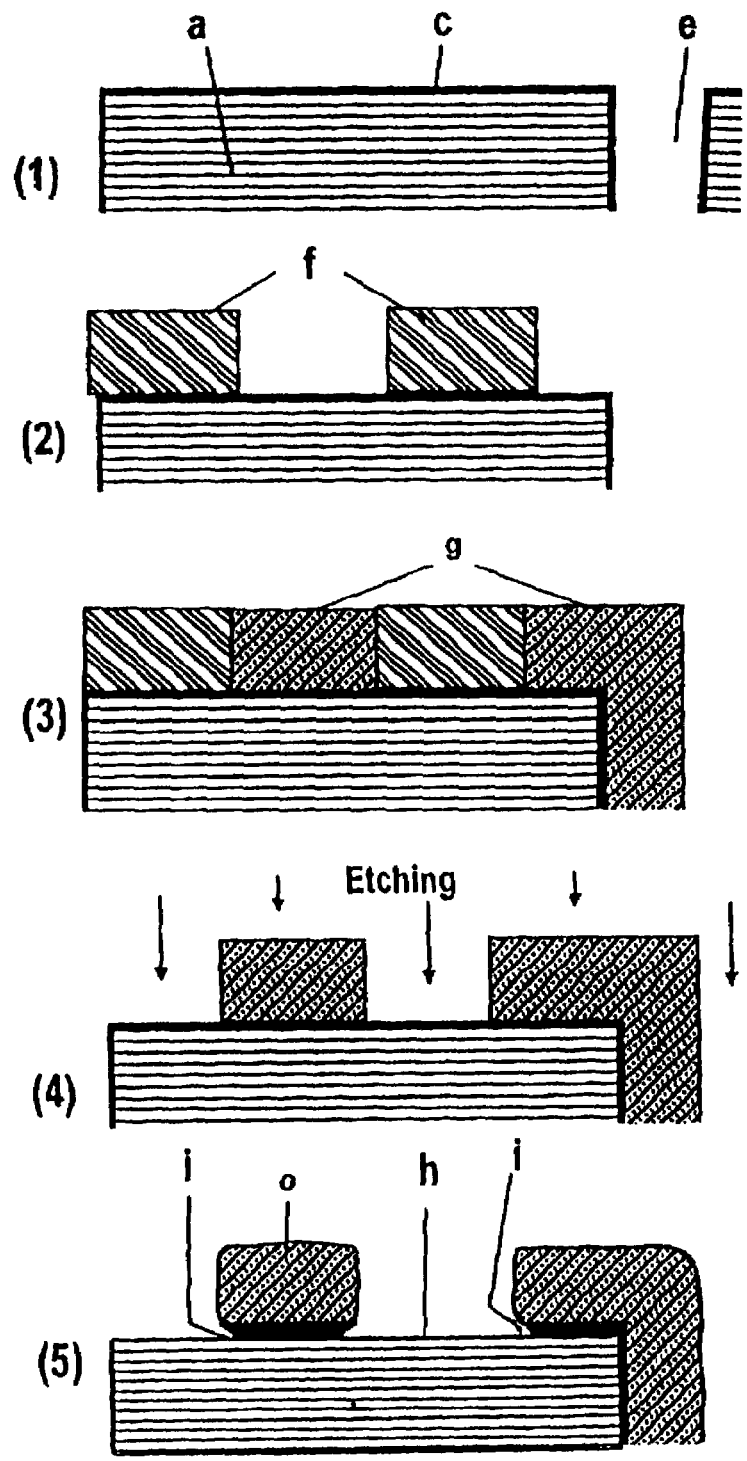
FIG. 5 is a process drawing showing steps of forming a fine pattern in Comparative Example 4.

Acrylonitrile-butadiene rubber (trade name: N210 S, supplied by JSR Corporation) in an amount of 5 parts was added to the same varnish as that obtained in Example 2 in an amount of 100 parts as a solid content, and these materials were homogeneously stirred and mixed. Then, a glass woven fabric having a thickness of 100 μm and a glass woven fabric having a thickness of 50 μm were independently impregnated with the so-prepared varnish to prepare prepregs similarly to Example 2. A laminate-formation was carried out similarly to Example 2 to produce a four-layered board. The copper foils as the external layers of the multilayer copper-clad board were removed by etching. Then, blind via holes having a diameter of 100 μm were made in the copper-clad board with a carbon dioxide gas laser at 15 mJ. A desmearing treatment was carried out on the surfaces. Electroless copper plating was entirely carried out to form a 1 μm thick electroless copper plating layer (FIG. 5(1)). An electrolytic copper plating resist was attached (FIG. 5(2)) A 16 μm thick electrolytic copper plating layer was formed on the electroless copper plating layer in a portion where the plating resist was not attached (FIG. 5(3)). After the plating resist was removed, the entire surface was etched (FIG. 5(4)) to dissolve and remove the thin electroless copper plating layer and to form a pattern having a line/space=20/20 μm (FIG. 5(5)). The pattern had small undercuts (i). Table 1 shows the results of evaluations.

TABLE 1

| | Examples | | Comparative Examples | | | |
| --- | --- | --- | --- | --- | --- | --- |
| | 1 | 2 | 1 | 2 | 3 | 4 |
| Undercut (μm) | <1 | <1 | 5.4 | <1 | 6.3 | 1.9 |
| Form of pattern cross-section | good | good | Defective | Triangular | Triangular | Almost good |
| Adhesion strength to copper foil (kgf/cm) | 1.32 | 1.15 | 0.65 | 0.90 | 0.67 | 0.79 |
| Grass transition temperature (° C.) | 235 | 160 | 235 | 160 | 235 | 153 |
| Anti-migration properties | | | | | | |
| Ordinary state | $5 \times 10^{14}$ | $6 \times 10^{14}$ | $5 \times 10^{14}$ | $4 \times 10^{14}$ | $5 \times 10^{14}$ | $4 \times 10^{14}$ |
| 200 hours | $3 \times 10^{11}$ | $4 \times 10^{8}$ | $3 \times 10^{11}$ | $2 \times 10^{8}$ | $4 \times 10^{11}$ | $<1 \times 10^{8}$ |
| 500 hours | $6 \times 10^{10}$ | $<1 \times 10^{8}$ | $7 \times 10^{10}$ | $<1 \times 10^{8}$ | $7 \times 10^{9}$ | — |

<Measurement Methods>

1) Undercut and the form of pattern cross-section: 100 pattern cross-sections were observed, to determine an average value. An etched length at one side to a design value was shown. Further, the form was also observed.

2) Adhesion strength to copper foil: Measured according to JIS C6481. The width was measured as a pattern width and the measured value was converted to kgf/cm.

3) Glass transition temperature: Measured according to the DMA method of JIS C6481.

4) Anti-migration properties: Prepreg obtained in each of Examples and Comparative Examples was laminated on the pattern produced in each of Examples and Comparative Examples. The resultant laminate was treated at 85° C. at 85% RH and after 50 VDC was applied, an insulation resistance value between patterns was measured.

Example 3

The same auxiliary material, the same backup sheet and the same double-side copper-clad laminate as those obtained in Example 1 were used. The auxiliary material and the backup sheet were similarly disposed on the upper surface and the lower surface of the double-side copper-clad laminate and the resultant set was similarly laminated.

Figure 6:
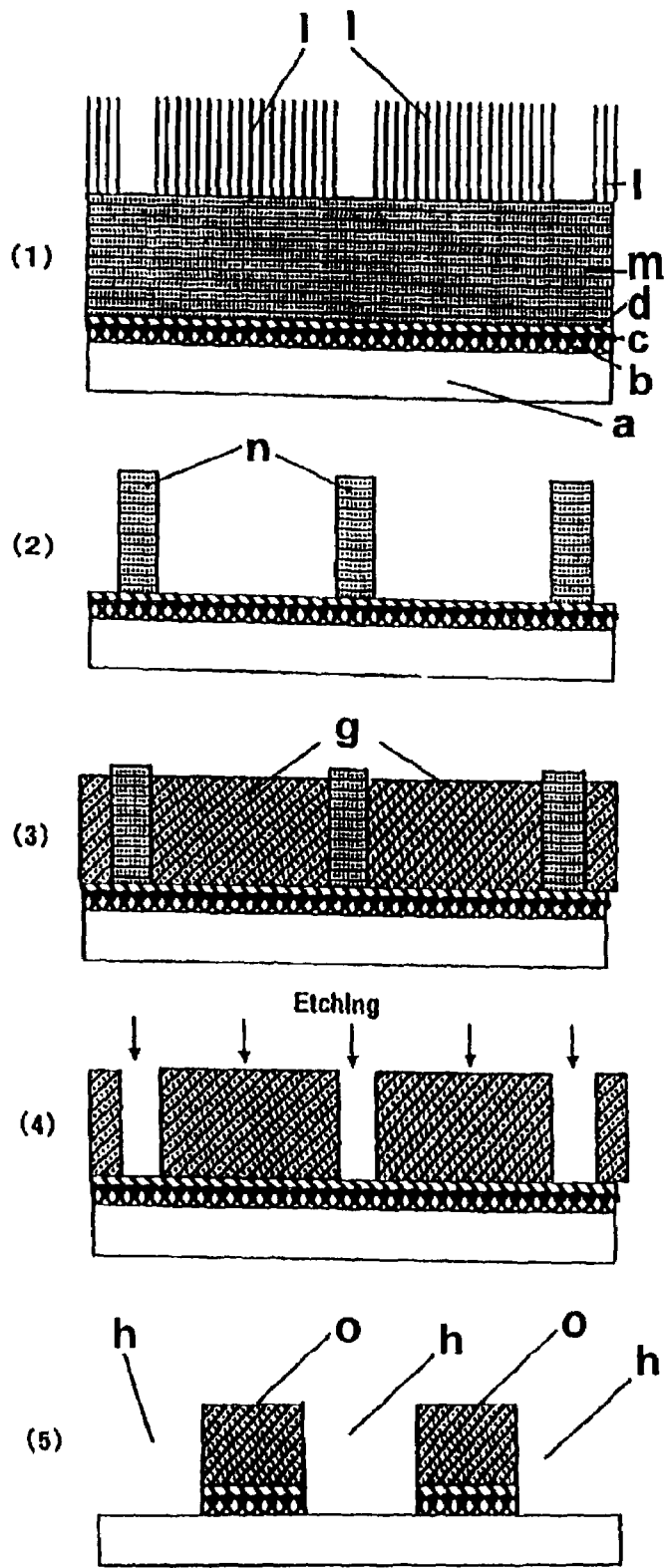
FIG. 6 is a process drawing showing steps of forming a fine pattern in Example 3 (1).

The upper surface of the laminate was 6 shots-irradiated directly with a carbon dioxide gas laser at a pulse energy of 30 mJ to make 900 penetration holes having a diameter of 100 µm for through holes at intervals of 1 mm. The penetration holes for through holes were made in 70 blocks. A desmearing treatment was carried out. Then, copper foil burrs around the holes were dissolved and removed by the SUEP method and at the same time the copper foils as the external layers were dissolved until each of the copper foils had a thickness of 2 µm. The resultant board was plated by electroless copper plating to form an electroless copper plating having a thickness of 0.4 µm. Then, the board was plated by electrolytic copper plating to form a copper layer having a thickness of 1 µm. A 25 µm thick positive type plating resist layer (trade name: URL-200, supplied by KANSAI PAINT CO., LTD.) for a pattern electrolytic copper plating was formed the above-obtained copper plating deposited layer. The positive type plating resist layer was irradiated in necessary portions with a UV laser having a wavelength of 265 nm at 1,200 J/m$^2$ so as to form portions having a width of 25 µm each (FIG. 6(1)). Then, the positive type plating resist layer in the irradiated portions was dissolved and removed, to obtain remaining resist portions having a width of 5 µm each (FIG. 6(2)). The board was plated by electrolytic copper plating to form a 24 µm thick electrolytic copper plating layer (FIG. 6(3)). The positive plating resist was removed. Then, the printed wiring board was entirely etched by flash etching with a SUEP solution (FIG. 6(4)), to form a pattern having a line/space=15/15 µm and a thickness of 20 µm (FIG. 6(5)). The cross-section of the pattern had no undercut caused by the etching and had a good form. The board was coated with a plating resist and nickel plating and gold plating were carried out. The printed wiring board was evaluated. Table 2 shows the results.

Example 4

The same four-layered board as that obtained in Example 2 was used. The protective metal plates were removed from the surfaces of the four-layered board. Each of the copper foil surfaces of the four-layered board was 1 shot irradiated with a carbon dioxide gas laser at 12 mJ to make blind via holes having a diameter of 100 µm in both the surfaces. The four-layered board was placed in a plasma device and a remaining resin in the bottom of each blind via hole was removed. The cobalt alloy treatments of the external layers were dissolved and removed with a chemical such that each of the copper foils had a thickness of 1 µm. Then, electroless copper plating was entirely carried out to form a 0.3 µm thick electroless copper plating layer. Then, electrolytic copper plating was carried out to form a 2 µm thick electrolytic copper plating layer. Then, the same positive type plating resist for electrolytic copper plating as that used in Example 3 was attached thereto to form a 25 µm thick plating resist layer. Then, irradiation with a UV laser was similarly carried out. The positive type plating resist layer in the irradiated portions was dissolved and removed, to prepare a substrate having a resist-removed portion width/a resist-remaining portion width=21/5 µm. The substrate was plated by electrolytic copper plating to form a 24 µm thick electrolytic copper plating layer. The positive type plating resist was removed. Then, the substrate was etched by flash etching with a SUEP solution, to produce a pattern a line/space=13/13 µm and thickness of 16 µm, the external layers were coated with a plating resist, and nickel plating and gold plating was carried out, to produce a printed wiring board. Table 2 shows the evaluation results of the printed wiring board.

Comparative Example 5

Figure 7:
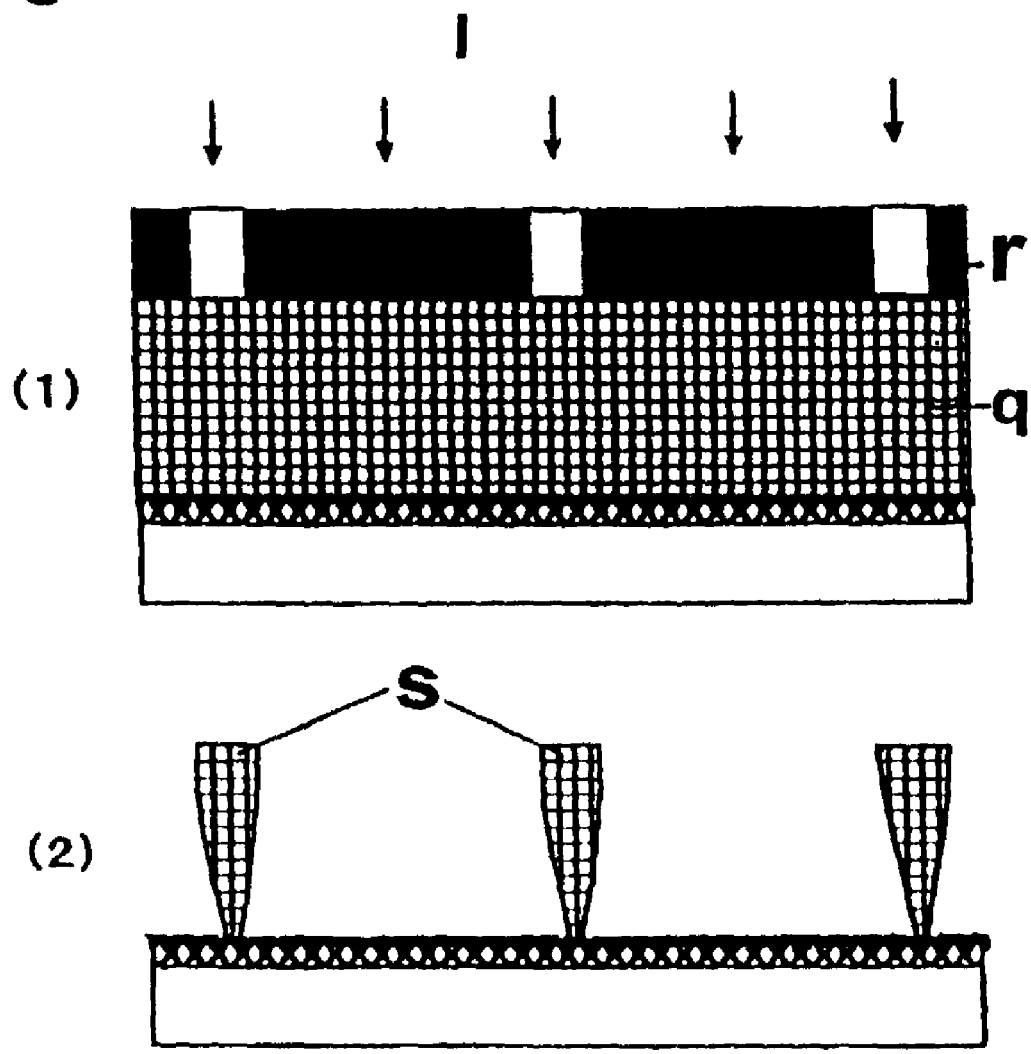
FIG. 7 is a process drawing showing steps of forming a fine pattern in Comparative Example 5 (1).

In the production of the printed wiring board in Example 3, copper plating was carried out by only electroless copper plating, the positive type plating resist was not used, a negative type plating resist layer having the same thickness was formed, a negative film was disposed thereon, those portions of the resist which had a width of 5 µm each were exposed to UV irradiation (FIG. 7(1)), and the non-irradiated portions having a width of 25 µm each were developed and removed (FIG. 7(2)). In this case, the resolution of the UV light beam was poor and most of the plating resist portions having a width of 5 µm were peeled off, so that a pattern could not be formed.

Comparative Example 6

Figure 8:
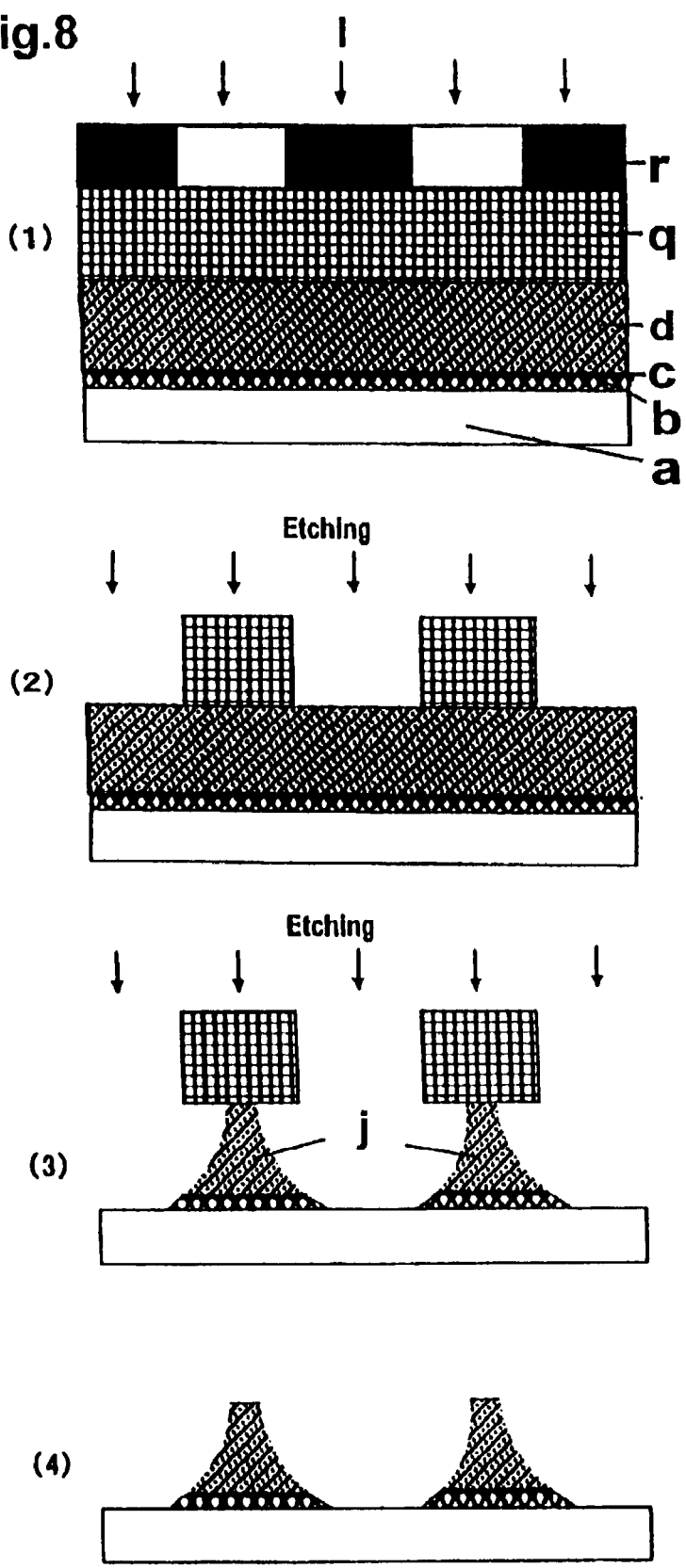
FIG. 8 is a process drawing showing steps of forming a fine pattern in Comparative Example 6 (2).

A four-layered copper-clad laminate was obtained in the same manner as in Example 4 except that the metal-plate-attached copper foils used as the external layers of the four-layered copper-clad laminate in Example 4 were replaced with 12 µm thick general electrolytic copper foils. The electrolytic copper foils of the four-layered copper-clad laminate were etched until each of the electrolytic copper foils had an average thickness of 3 µm, whereby a roughness of 3 µm was formed on each surface. The resultant four-layered copper-clad laminate was placed on an XY table. Each of the surfaces of the copper-clad board was 2 shots irradiated with a carbon gas laser at a pulse energy of 10 mJ to make blind via holes. After a plasma treatment was similarly carried out, a 0.3 µm thick electroless copper plating layer was formed and then a 15 µm thick electrolytic copper plating layer was formed thereon. A 15 µm thick negative type etching resist layer was formed thereon. Then, a pattern having a line/space=13/13 µm was formed (FIG. 8(1)–(4)). The form thereof was triangular and it was not good. Many short-circuits of the pattern were found. Table 2 shows the results of evaluations.

Comparative Example 7

A printed wiring board was obtained in the same manner as in Example 3 except that the thickness of the electroless copper plating layer was changed from 0.4 µm to 2 µm and that the first electrolytic copper plating was not carried out. The undercut was 4.4 µm. A printed wiring board was similarly produced. Table 2 shows the results of evaluations.

TABLE 2

|  | Examples | | Comparative Examples | | |
| --- | --- | --- | --- | --- | --- |
|  | 3 | 4 | 5 | 6 | 7 |
| Undercut (μm) | <1 | <1 | — | <1 | 4.4 |
| Form of pattern cross-section | good | good | Could not formed | Triangular | Almost good |
| Peeling of pattern | Nil | Nil | Yes | Nil | Nil |
| Short circuit of pattern | Nil | Nil | — | Yes | Nil |
| Adhesion strength to copper foil (kgf/cm) | 1.33 | 1.17 | — | 0.73 | 0.46 |
| Grass transition temperature (° C.) | 235 | 160 | 235 | 159 | 235 |
| Anti-migration properties | | | | | |
| Ordinary state | 6 × 10$^{14}$ | 5 × 10$^{14}$ | — | — | 5 × 10$^{14}$ |
| 200 hours | 2 × 10$^{11}$ | 5 × 10$^{8}$ | — | — | 2 × 10$^{11}$ |
| 500 hours | 4 × 10$^{10}$ | <1 × 10$^{8}$ | — | — | 3 × 10$^{10}$ |

<Measurement Methods>

1) Undercut, form of pattern cross-section, peeling of pattern, and short circuit of pattern: 100 patterns were observed from the upper side and the cross-sections of the 100 patterns were also observed. Undercut was expressed by an average value. An etched length at one side to a design value was shown. Further, the form, the peeling and the short circuit thereof were also observed.

2) Adhesion strength to copper foil: Measured according to JIS C6481. The width was measured as a pattern width and the measured value was converted to kgf/cm.

3) Glass transition temperature: Measured according to the DMA method of JIS C6481.

4) Anti-migration properties: The pattern obtained in each of Examples and Comparative Examples was coated with a 40 μm thick layer of a thermosetting type resist (trade name: BT-M450, supplied by Mitsubishi Gas Chemical Company, Inc.), and the thermosetting type resist was cured. The resultant pattern was treated at 85° C. at 85% RH and after 50 VDC was applied, an insulation resistance value between patterns was measured.

Example 5

900 Parts of 2,2-bis(4-cyanatophenyl)propane and 100 parts of bis(4-maleimidephenyl)methane were melted at 150° C. and allowed to react for 4 hours with stirring, to prepare a prepolymer. The prepolymer was dissolved in mixed solvents of methyl ethyl ketone and dimethylformamide. To this solution were added 400 parts of a bisphenol A type epoxy resin (trade name: Epikote 1001, supplied by Japan Epoxy Resins Co., Ltd) and 600 parts of a cresol novolak type epoxy resin (trade name: ESCN-220F, supplied by Sumitomo Chemical Co., Ltd.), and these materials were homogeneously dissolved and mixed. Further, as a catalyst, 0.4 part of zinc octylate was added, and these materials were dissolved and mixed. To the resultant mixture was added 2,000 parts of an inorganic filler (trade name: Calcined Talc, supplied by Nippon Talc K.K.), and these materials were homogeneously stirred and mixed to prepare a varnish. A glass woven fabric having a thickness of 100 μm was impregnated with the above varnish, and the impregnated glass woven fabric was dried at 150° C. to prepare prepreg C having a gelation time of 80 seconds at 170° C. and having a thermosetting resin composition content of 44% by weight. Further, a glass woven fabric having a thickness of 50 μm was impregnated with the above varnish, and the impregnated glass woven fabric was dried at 150° C. to prepare prepreg D having a gelation time of 120 seconds at 170° C. and having a thermosetting resin composition content of 70% by weight. Four sheets of the prepreg C were stacked, 18 μm thick general electrolytic copper foils were placed on the upper and lower surfaces of the stacked prepregs, one on each surface, and the resultant set was laminate-formed at 200° C. at 20 kgf/cm$^2$ under a vacuum of 30 mmHg or less for 2 hours, to obtain a double-side copper-clad laminate having an insulation layer thickness of 0.4 mm. Patterns were formed on both the surfaces of the double-side copper-clad laminate, and both the surfaces were treated to form black copper oxide. The prepreg D was placed on each surface of the double-side copper-clad laminate, and a copper foil obtained by forming a 2.5 μm thick nickel treatment on a mat surface of a 12 μm thick general electrolytic copper foil (mat surface roughness Rz: 4.2 μm) was disposed on each surface. The resultant set was similarly laminate-formed to obtain a four-layered double-side copper-clad laminate. The 12 μm thick general electrolytic copper foils on the upper and lower surfaces were removed by etching with an alkaline etchant to leave only the nickel treatments having a thickness of 2.5 μm each, whereby there was prepared a four-layered double-side metal-clad laminate having the nickel treatments left on both the surfaces.

Figure 9:
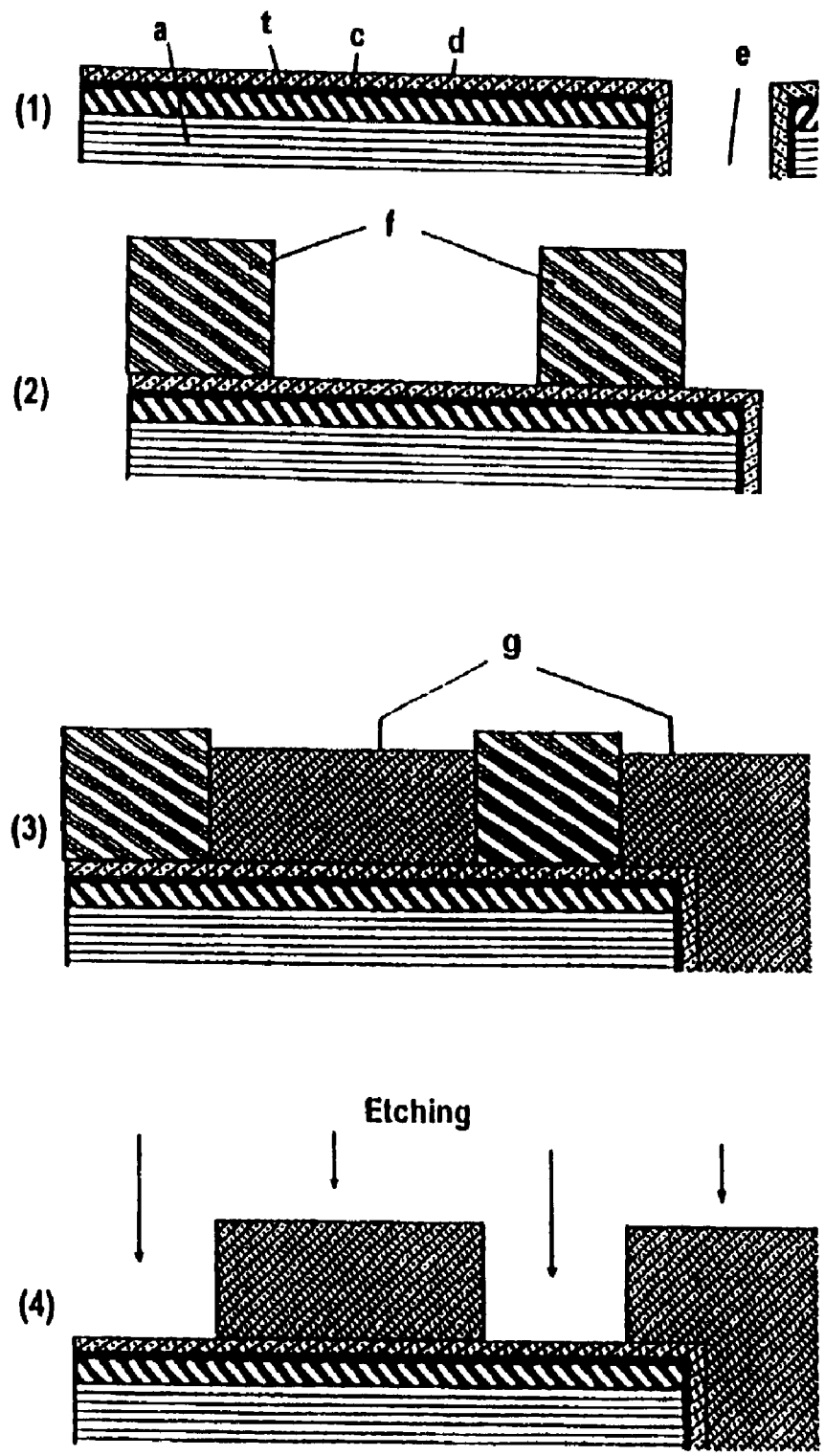
FIG. 9 is a process drawing showing steps (first half) of forming a fine pattern in Example 5.
Figure 10:
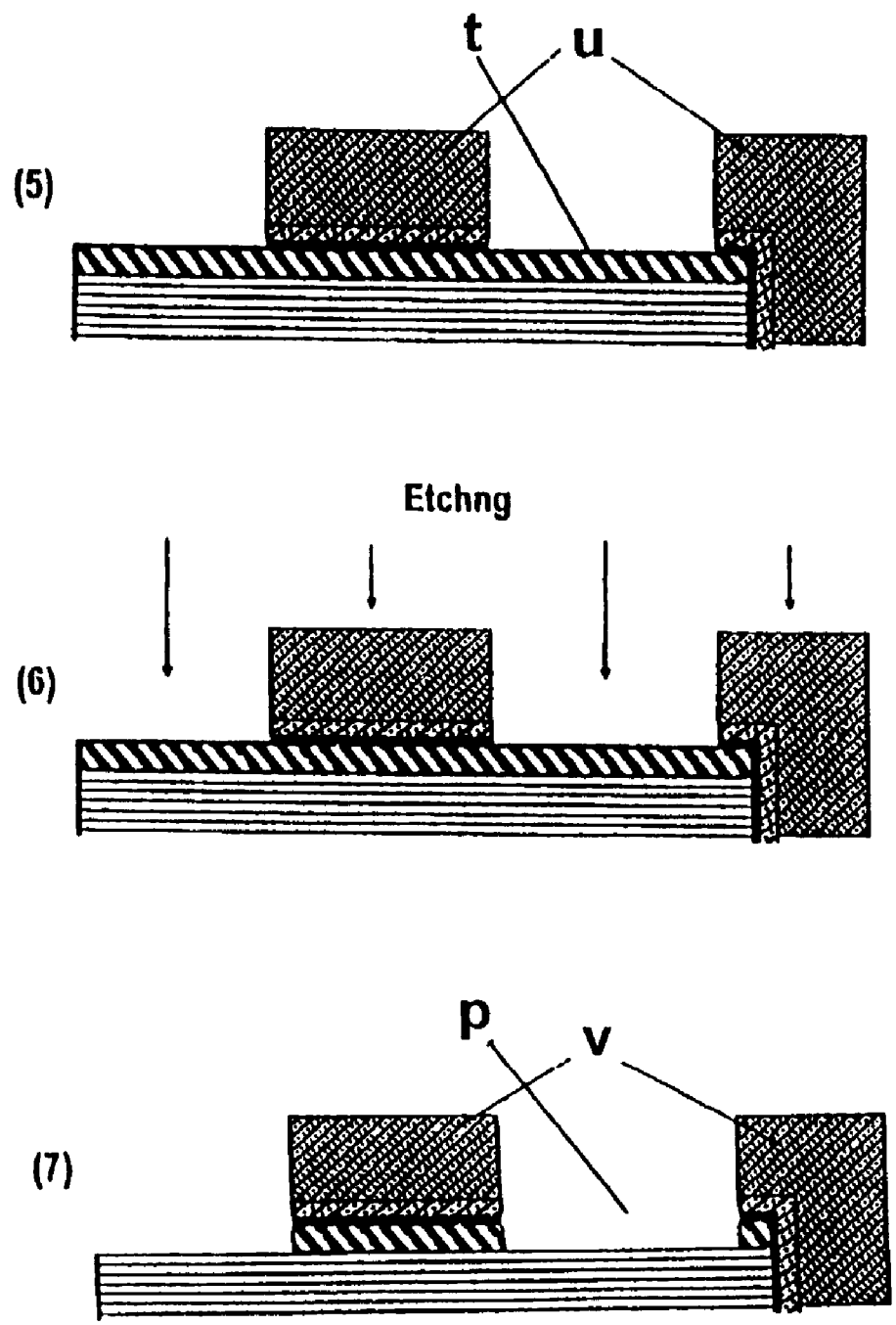
FIG. 10 is a process drawing showing steps (latter half) of forming a fine pattern in Example 5.

Separately, a polyvinyl alcohol powder was dissolved in water to obtain a solution, the solution was applied to one surface of a 50 μm thick aluminum to form a resin layer having a thickness of 30 μm, and the resin layer was dried to prepare a backup sheet. The backup sheet was disposed on the lower surface of the four-layered double-side metal-clad laminate such that the resin layer surface of the backup sheet faced to the nickel side. The resultant set was laminated with a roll at 100° C. at a linear pressure of 15 kgf/cm, to bond the backup sheet to the lower surface. The upper surface of the resultant laminate was 6 shots-irradiated directly with a carbon dioxide gas laser at a pulse energy of 10 mJ to make penetration holes having a diameter of 100 μm each at intervals of 1 mm. Further, blind via holes having a diameter of 100 μm each were made by 1 shot-irradiation at a pulse energy of 12 mJ. A desmearing treatment was carried out. Then, the nickels were etched with a chemical capable of dissolving nickel (trade name: Pewtax, supplied by supplied by Mitsubishi Gas Chemical Company, Inc.) until each of the nickel foils had a thickness of 2 μm, and then, a few nickel burrs around the holes were dissolved and removed. The resultant laminate was plated by electroless copper plating to form an electroless copper plating layer having a thickness of 0.4 μm. Then, the laminate was plated by electrolytic copper plating to form a copper layer having a thickness of 1 μm (FIG. 9(1)). A 18 μm thick resist layer for a pattern electrolytic copper plating was formed on necessary portions of the above-obtained copper plating deposited layer (FIG. 9(2)). A pattern copper plating layer having a thickness of 15 μm was formed on the copper surface in portions where the plating resist layer was not formed, by electrolytic copper plating (FIG. 9(3)). The plating resist was entirely removed. Then, the entire surface was etched with an alkaline etchant to remove the thin electrolytic copper layer and the electroless copper layer (FIG. 9(4), FIG. 10(5)). Then, only the nickel layers were etched and removed with the same chemical capable of dissolving nickel as above (FIG. 10(6), (7)), to form a pattern having a line/space=25/25 μm. The cross section of the pattern had no undercut caused by the etching and had a good form. A UV selective thermosetting permanent protective resist was attached thereon and nickel plating and gold plating were carried out to obtain a high-density printed wiring board. Table 3 shows the evaluation results of the printed wiring board.

Example 6

700 parts of an epoxy resin (trade name: Epikote 5045), 300 parts of an epoxy resin (trade name: ESCN220F), 35 parts of dicyandiamide and 1 part of 2-ethyl-4-methylimidazole were dissolved in mixed solvents of methyl ethyl ketone and dimethylformamide. 800 parts of the same calcined talc as that used in Example 5 was added to this solution, and these materials were homogeneously dispersed by forcedly stirring to prepare a varnish. A glass woven fabric having a thickness of 100 μm was impregnated with the above varnish, and the impregnated glass woven fabric was dried to prepare prepreg having a gelation time of 150 seconds and having a thermosetting resin composition content of 45% by weight. Six sheets of the prepreg were stacked. A copper foil obtained by forming a 3 μm thick nickel/cobalt alloy treatment on a mat surface of a 12 μm thick general electrolytic copper foil (mat surface roughness Rz: 2.7 μm) was disposed on each surface of the stacked prepregs such that the alloy surface of the copper foil faced the prepreg side. The resultant set was laminate-formed at 190° C. at 20 kgf/cm² under a vacuum of 30 mmHg or less for 2 hours, to obtain a double-side copper-clad laminate. The electrolytic copper foil parts of the above copper foils on both the surfaces were removed by etching such that the 3 μm thick nickel/cobalt alloy treatment layers of the above copper foils were left. Then, the same backup sheet as that obtained in Example 1 was disposed on the lower surface of the laminate and the resultant set was similarly laminated to bond the backup sheet to the lower surface. The upper surface of the resultant laminate was 8 shots irradiated with a carbon dioxide gas laser at a pulse energy of 10 mJ to make penetration holes having a diameter of 100 μm each. The laminate was placed in a plasma device. A desmearing treatment was carried out. Then, the entire surface was plated by electroless copper plating to form an electroless copper plating layer having a thickness of 0.3 μm. Then, an electrolytic copper plating layer having a thickness of 2 μm was formed thereon. Then, a plating resist for electrolytic copper plating was attached thereto to form a plating resist layer having a thickness of 15 μm. An electrolytic copper plating layer having a thickness of 14 μm was formed on the copper surface in portions where the plating resist layer was not formed. The plating resist was removed. Then, the entire surface was etched by flash etching with an alkaline etchant to remove the thin electrolytic copper layer and the electroless copper layer until each of the nickel/cobalt alloy layers was exposed. Further, the remaining nickel/cobalt alloy treatment layers were dissolved and removed with the same chemical capable of dissolving nickel type metals as that used in Example 5, whereby there was produced a high-density printed wiring board having a line/space=20/20 μm. Necessary portions were coated with a UV selective thermosetting type permanent protective resist, and then nickel plating and gold plating were carried out to complete a printed wiring board. Table 3 shows the results of evaluations.

Comparative Example 8

Figure 11:
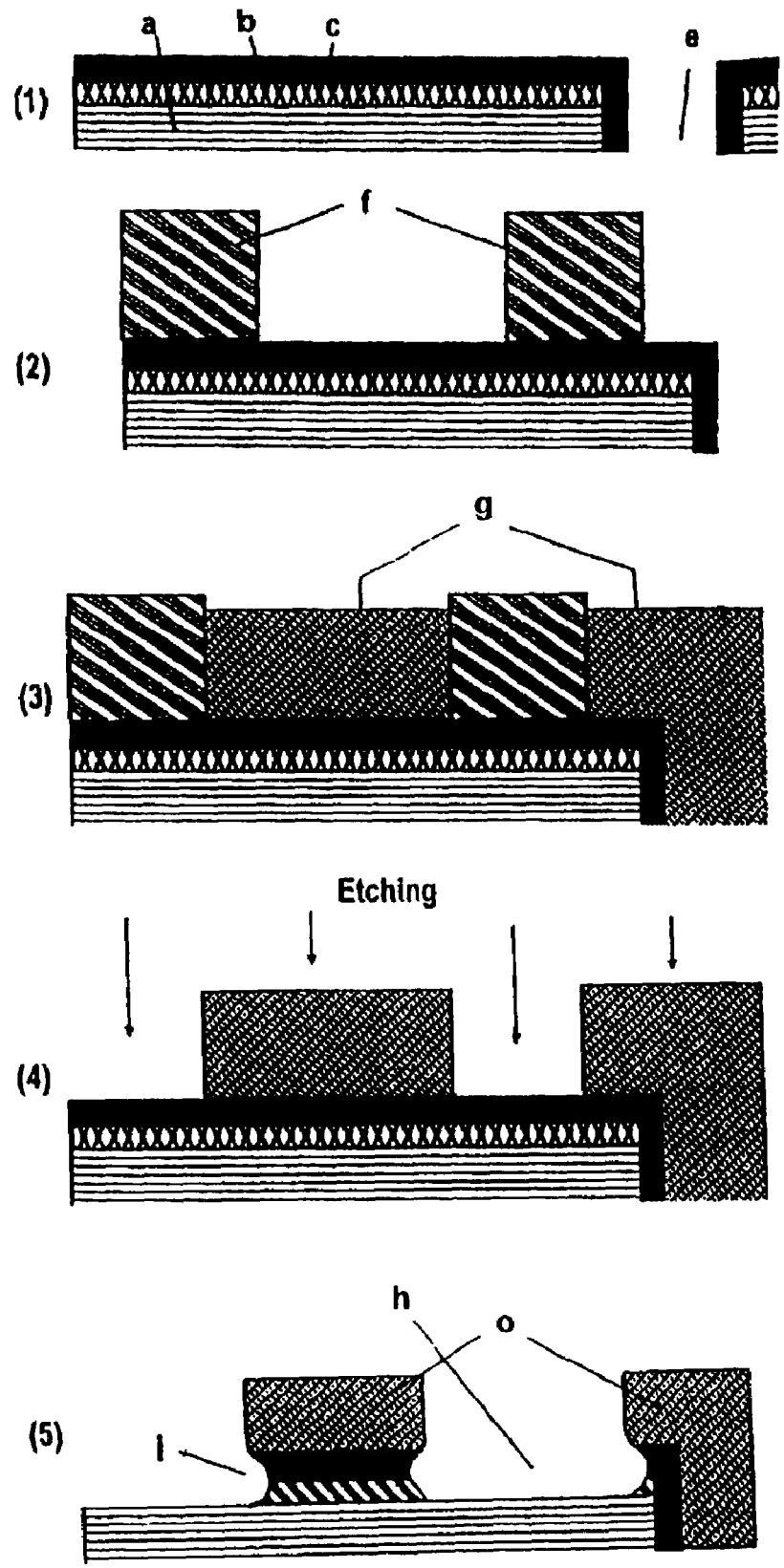
FIG. 11 is a process drawing showing steps of forming a fine pattern in Comparative Example 8.

In the production of the printed wiring board in Example 5, a four-layered double-side copper-clad laminate was made with 12 μm-thick general electrolytic copper foils. The electrolytic copper foils were etched until each of the electrolytic copper foils had an average thickness of 3 μm, whereby a roughness of 1 μm was formed on each surface. The resultant copper-clad laminate was placed on an XY table. The front surface of the copper-clad board was 6 shots irradiated with a carbon gas laser at a pulse energy of 12 mJ to make penetration holes having a diameter of 100 μm each. Further, blind via holes having a diameter of 100 μm each were made by 1 shot irradiation at a pulse energy of 12 mJ. After a desmearing treatment was carried out, only a 0.3 μm thick electroless copper plating layer was formed, and the following electrolytic copper plating was not carried out. A pattern electrolytic copper plating layer was formed directly on the electroless copper plating layer (FIG. 11(1)). The resultant laminate was similarly etched to remove the thin electroless copper layer and the ultrathin copper foil layer to which the pattern copper plating was not attached, whereby there was obtained a printed wiring board (FIG. 11(2)–(5)). The lower part of the pattern had an undercut of 5.4 μm at each side. Table 3 shows the results of evaluations.

Comparative Example 9

Figure 12:
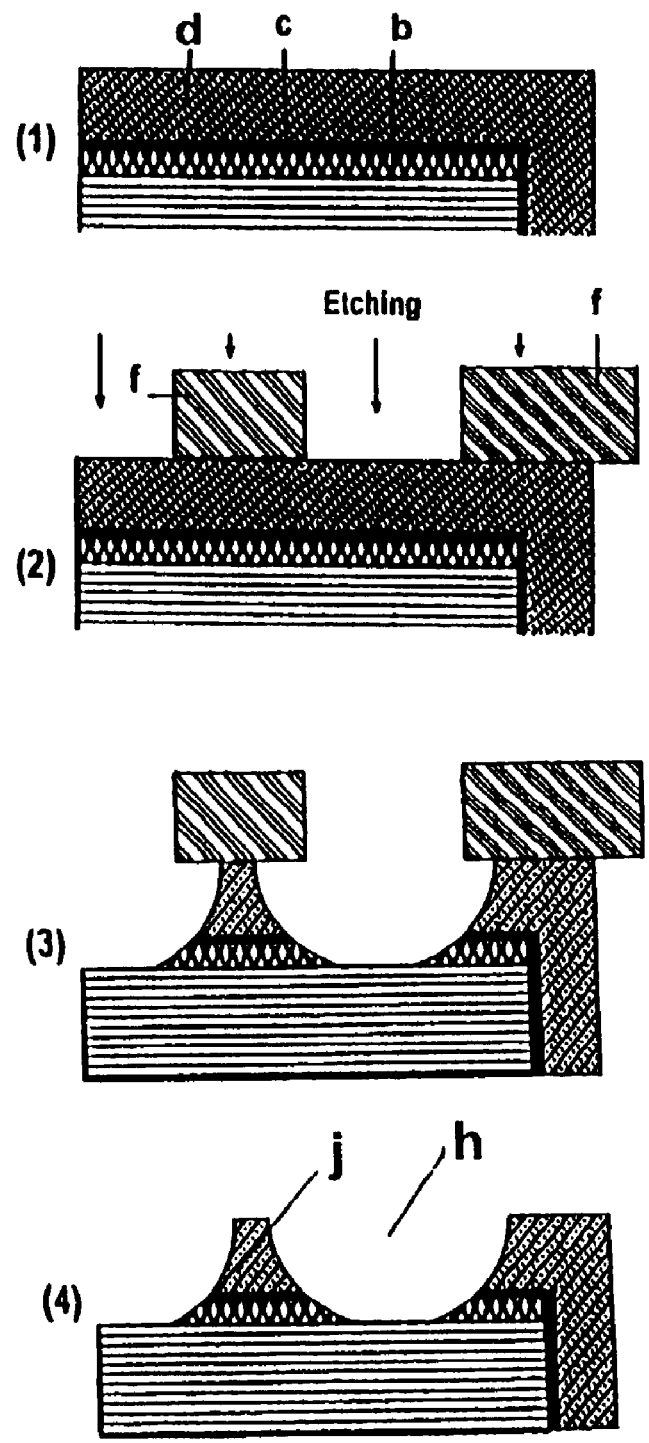
FIG. 12 is a process drawing showing steps of forming a fine pattern in Comparative Example 9.

A double-side copper-clad laminate was obtained in the same manner as in Example 6 except that the copper foils having a nickel/cobalt alloy treatment used as the external layers of the double-side copper-clad laminate in Example 6 were replaced with 12 μm thick general electrolytic copper foils. The electrolytic copper foils of the double-side copper-clad laminate were etched until each of the electrolytic copper foils had an average thickness of 3 μm, a roughness of 1 μm was formed on each surface. The resultant copper-clad laminate was placed on an XY table. The upper surface of the copper-clad laminate was 8 shots irradiated with a carbon gas laser at a pulse energy of 10 mJ to make penetration holes. After a plasma treatment was similarly carried out, a 0.3 μm thick electroless copper plating layer was formed and then a 14 μm thick electrolytic copper plating layer was formed thereon (FIG. 12(1)). A 20 μm thick etching resist layer was formed thereon. Then, a pattern having a line/space=20/20 μm was formed by a general method(FIG. 12(2)–(4)). The form thereof was triangular and it was not good. Table 3 shows the results of evaluations.

Comparative Example 10

Figure 13:
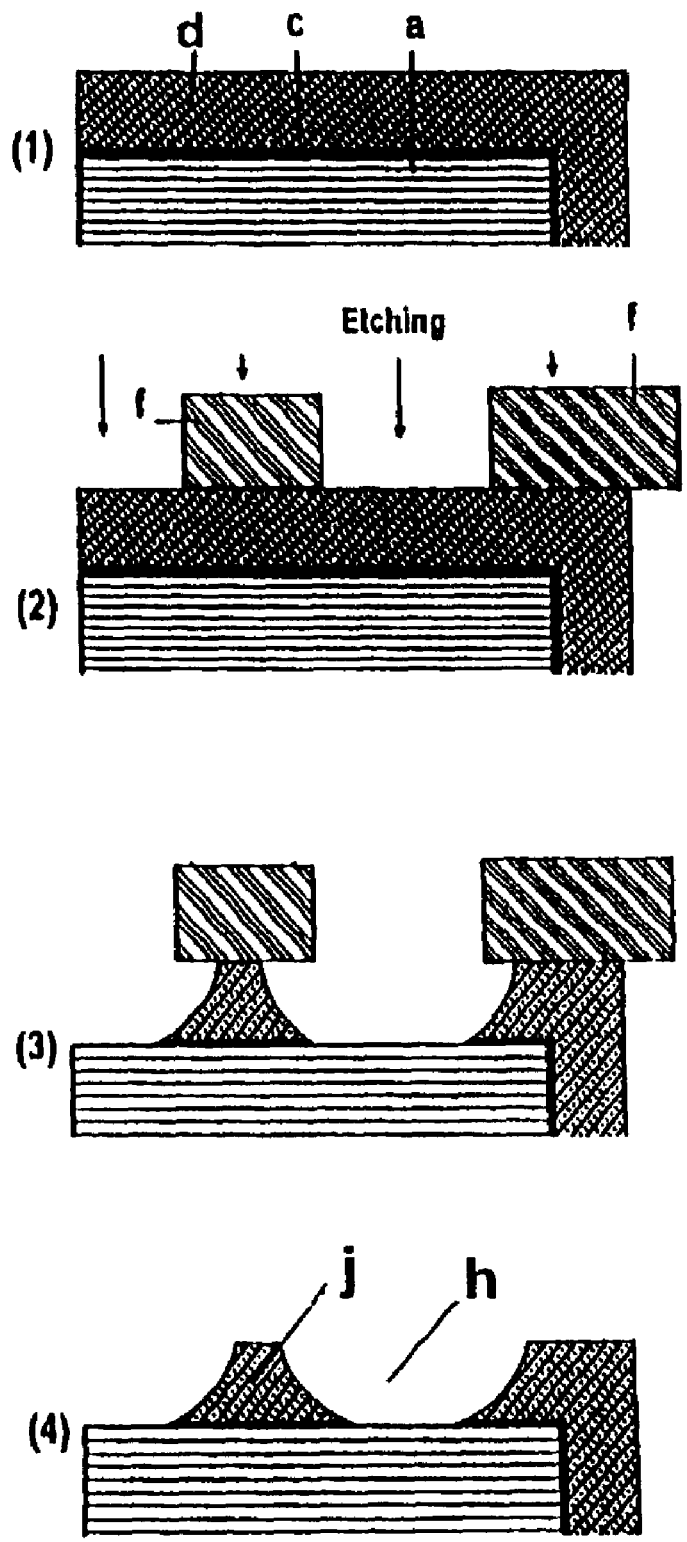
FIG. 13 is a process drawing showing steps of forming a fine pattern in Comparative Example 10.

The same double-side copper-clad multilayer board as that in Example 5 was used. The copper foils as the external layers and the nickel metal layers were removed by etching. Then, penetration holes having a diameter of 100 μm were made in the multilayer board with a carbon dioxide gas laser at 15 mJ. The surfaces thereof were treated by desmearing treatment. Electroless copper plating was carried out to form an electroless copper plating layer having a thickness of 2 μm. An electrolytic copper plating layer having a thickness of 16 μm was formed thereon (FIG. 13(1)). Then, a pattern having a line/space=25/25 μm was formed in the same manner as in Comparative Example 9 (FIG. 13(2)–(4)). The pattern had undercuts and the form thereof was triangular and was defective. Table 3 shows the results of evaluations.

Comparative Example 11

Figure 14:
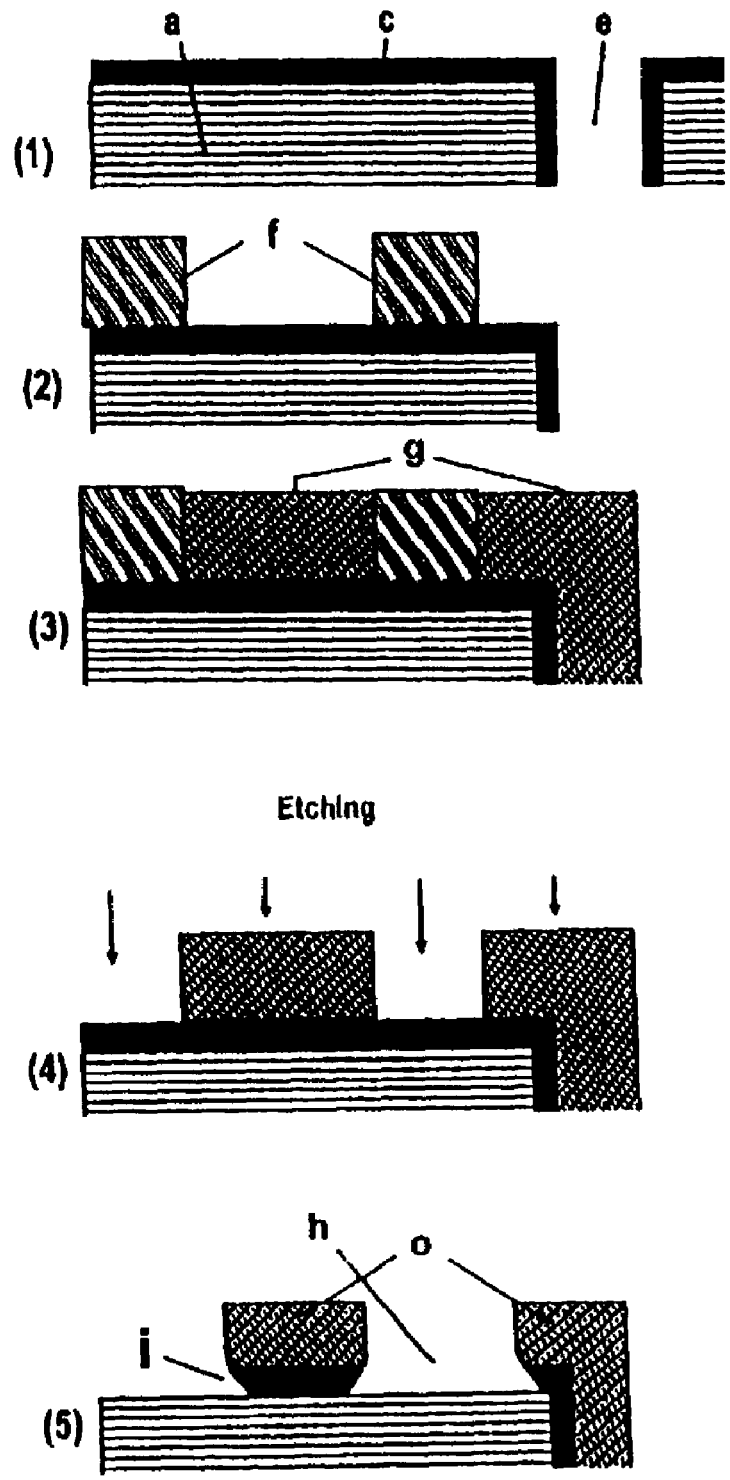
FIG. 14 is a process drawing showing steps of forming a fine pattern in Comparative Example 11.

Acrylonitrile-butadiene rubber (trade name: N210 S, supplied by JSR Corporation) in an amount of 3 parts was added to the same varnish as that obtained in Example 6 in an amount of 100 parts as a solid content, and the components were homogeneously stirred and mixed. Then, prepreg was prepared similarly to Example 6, and a laminate-formation was carried out similarly to Example 6, to produce a double-side copper-clad laminate. The copper foils as the external layers and the nickel/cobalt layers were removed by etching. Then, penetration holes having a diameter of 100 µm were made in the copper-clad laminate with a carbon dioxide gas laser at 10 mJ. The surfaces were treated by a desmearing treatment. The entire surface was plated by electroless copper plating to form a 4 µm thick electroless copper plating layer (FIG. 14(1)). An electrolytic copper plating resist was attached (FIG. 14(2)). A 16 µm thick electrolytic copper plating layer was formed on the electroless copper plating layer in portions where the plating resist was not attached (FIG. 14(3)). After the plating resist was removed, the entire surface was etched to dissolve and remove the thin electroless copper plating layer and to form a pattern having a line/space=20/20 µm (FIG. 14(4)–(5)). The pattern had undercuts. Table 3 shows the results of evaluations.

disposed on both the outer surfaces such that each of the surfaces having bumps faced the prepreg side. The resultant set was similarly laminate-formed to produce a four-layered double-side copper-clad laminate. The 12 µm thick general electrolytic copper foils on the front and reverse surfaces were removed by etching with an alkaline etchant to leave only the nickel treatment layers on both the surfaces, whereby there was prepared a four-layered double-side metal-clad laminate having the nickel treatment layers left.

A backup sheet was obtained in the same manner as in Example 5. The backup sheet was disposed on the lower surface of the four-layered double-side nickel-metal-clad laminate such that the resin layer surface of the backup sheet faced to the copper foil side. The resultant set was laminated with a roll at 100° C. at a linear pressure of 15 kgf/cm. The surface opposite to the backup sheet was 6 shots-irradiated directly with a carbon dioxide gas laser at a pulse energy of 10 mJ to make penetration holes having a diameter of 100 µm each at intervals of 1 mm. Further, the surface was 1 shot-irradiated at a pulse energy of 12 mJ to make blind via holes having a diameter of 100 µm each. A desmearing treatment was carried out. The resultant laminate was plated by electroless copper plating to form an electroless copper plating layer having a thickness of 0.4 µm. Then, electrolytic

TABLE 3

|  | Examples | | Comparative Examples | | | |
| --- | --- | --- | --- | --- | --- | --- |
|  | 5 | 6 | 8 | 9 | 10 | 11 |
| Undercut (µm) | <1 | <1 | 5.5 | <1 | 2.2 | 6.1 |
| Form of pattern cross-section | Good | Good | Defective | Triangular | Triangular | Defective |
| Adhesion strength to copper foil (kgf/cm) | 1.33 | 1.18 | 0.67 | 0.90 | 0.43 | 0.55 |
| Grass transition temperature (° C.) | 235 | 160 | 235 | 160 | 235 | 154 |
| Anti-migration properties |  |  |  |  |  |  |
| Ordinary state | $5 \times 10^{14}$ | $6 \times 10^{14}$ | $5 \times 10^{14}$ | $4 \times 10^{14}$ | $5 \times 10^{14}$ | $5 \times 10^{14}$ |
| 200 hours | $3 \times 10^{11}$ | $4 \times 10^{8}$ | $3 \times 10^{11}$ | $2 \times 10^{8}$ | $4 \times 10^{11}$ | $2 \times 10^{8}$ |
| 500 hours | $6 \times 10^{10}$ | $<10^{8}$ | $7 \times 10^{10}$ | $<10^{8}$ | $5 \times 10^{10}$ | $<10^{8}$ |

<Measurement Methods>
1) Undercut and the form of pattern cross-section
2) Adhesion strength to copper foil
3) Glass transition temperature The above measurements were carried out by the same measurement methods as those employed in Example 1.

4) Anti-migration properties:

The measurement method for 4) was the same measurement method as that employed in Example 3.

Example 7

The same double-side copper-clad laminate having an insulation layer thickness of 0.4 mm as that obtained in Example 5 was used. Patterns were formed thereon. A treatment to form black copper oxide was carried out. Then, the same prepregs C as that obtained in Example 5 were placed on the upper and lower surfaces, one on one surface. Copper foils each obtained by forming a 2 µm thick nickel treatment layer on a surface of a 12 µm thick general electrolytic copper foil and further forming bumps of nickel (roughness Rz: 4.2 µm) on the nickel treatment layer were copper plating was carried out to form a copper layer having a thickness of 1 µm. A 18 µm thick resist layer for a pattern electrolytic copper plating was formed on necessary portions of the above-obtained copper plating deposited layer. A pattern copper plating layer having a thickness of 15 µm was formed on the copper surface in portions where the plating resist layer was not formed, by electrolytic copper plating. The plating resist was entirely removed. Then, the entire surface was etched with an alkaline etchant to remove the thin electrolytic copper layer and the electroless copper layer. Then, etching was entirely carried out with a chemical capable of dissolving nickel (trade name: Pewtax, supplied by supplied by Mitsubishi Gas Chemical Company, Inc.) to etch and remove the nickel layers, whereby patterns having a line/space=25/25 µm was formed. The cross section of the pattern had no undercut caused by the etching and had a good form. AUV-selective thermosetting permanent protective resist was attached thereon and nickel plating and gold plating were carried out to obtain a high-density printed wiring board. Table 4 shows the evaluation results of the printed wiring board.

Example 8

Prepreg was prepared in the same manner as in Example 6. Six sheets of the prepreg were stacked. A nickel/cobalt alloy treatment of 1.5 μm was formed on a mat surface of a general electrolytic copper foil (mat surface roughness Rz: 2.7 μm) having a thickness of 12 μm and further bumps (roughness Rz: 3.7 μm) of a nickel/cobalt alloy were formed on the nickel/cobalt alloy treatment to prepare a carrier-copper-foil-attached metal foil. The carrier-copper-foil-attached metal foils prepared as above were disposed on both the surfaces of the stacked prepregs, one on each surface, such that the bump surface of each of the carrier-copper-foil-attached metal foils faced the prepreg side. The resultant set was laminate-formed at 190° C. at 20 kgf/cm² under a vacuum of 30 mmHg or less for 2 hours, to obtain a double-side copper-clad laminate. The electrolytic copper foil parts of the carrier-copper-foil-attached metal foils on both the surfaces were removed by etching such that the nickel/cobalt alloy treatment layers of the carrier-copper-foil-attached metal foils were left. Then, the same backup sheet as that obtained in Example 1 was disposed on the lower surface and the resultant set was similarly laminated to bond the backup sheet to the lower surface. The front surface of the resultant laminate was 8 shots irradiated with a carbon dioxide gas laser at a pulse energy of 10 mJ to make penetration holes having a diameter of 100 μm each. The laminate was placed in a plasma device. A desmearing treatment was carried out. Then, the entire surface was plated by electroless copper plating to form an electroless copper plating layer having a thickness of 0.3 μm. Then, an electrolytic copper plating layer having a thickness of 2 μm was formed thereon. Then, a plating resist for electrolytic copper plating was attached thereto to form a plating resist layer having a thickness of 15 μm. An electrolytic copper foil layer having a thickness of 14 μm was formed on the copper surface in portions where the plating resist layer was not formed. The plating resist was removed. Then, the entire surface was etched by flash etching with an alkaline etchant to remove the thin electrolytic copper layer and the electroless copper layer until each of the nickel/cobalt alloy layers was exposed. Further, the remaining nickel/cobalt alloy treatment layers were dissolved and removed with the same chemical capable of dissolving nickel type metals as that used in Example 7, whereby there was produced a high-density printed wiring board having a line/space=20/20 μm. Necessary portions were coated with a UV selective thermosetting type permanent protective resist, and then nickel plating and gold plating were carried out to complete a printed wiring board. Table 4 shows the results of evaluations.

Comparative Example 12

In the production of the printed wiring board in Example 7, the copper foils having a nickel treatment layer and having nickel bumps disposed as the external layers were replaced with 12 μm thick general electrolytic copper foils to obtain a four-layered double-side copper-clad laminate. The electrolytic copper foils were etched until each of the electrolytic copper foils had an average thickness of 3 μm, whereby a roughness of 1 μm was formed on each surface. The resultant copper-clad laminate was placed on an XY table. The front surface of the copper-clad laminate was 6 shots irradiated with a carbon gas laser at a pulse energy of 12 mJ to make penetration holes having a diameter of 100 μm each. Further, blind via holes having a diameter of 100 μm each were made by 1 shot irradiation at 12 mJ. After a desmearing treatment was carried out, only a 0.3 μm thick electroless copper plating layer was formed. Without carrying out the following electrolytic copper plating, a pattern electrolytic copper plating layer was formed directly on the electroless copper plating layer. The resultant laminate was similarly etched to remove the thin electroless copper layer and the ultrathin copper foil layer to which the pattern copper plating was not attached, whereby there was obtained a printed wiring board. The lower part of the pattern had an undercut of 5.4 μm at each side. Table 4 shows the results of evaluations.

Comparative Example 13

A double-side copper-clad laminate was obtained in the same manner as in Example 8 except that the carrier-copper-foil-attached metal foils used as the external layers in Example 8 were replaced with 12 μm thick general electrolytic copper foils. The electrolytic copper foils of the double-side copper-clad laminate were etched until each of the electrolytic copper foils had an average thickness of 3 μm, whereby a roughness of 1 μm was formed on each surface. The resultant copper-clad laminate was placed on an XY table. The upper surface of the copper-clad laminate was 8 shots irradiated with a carbon gas laser at a pulse energy of 10 mJ to make penetration holes. After a plasma treatment was similarly carried out, a 0.3 μm thick electroless copper plating layer was formed and then a 14 μm thick electrolytic copper plating layer was formed thereon. A 20 μm thick etching resist layer was formed thereon. Then, a pattern having a line/space=20/20 μm was formed by a general method. The form thereof was triangular and it was not good. Table 4 shows the results of evaluations.

Comparative Example 14

The same double-side copper-clad multilayer board as that in Example 7 was used. The copper foils as the external layers and the nickel metal layers were removed by etching. Then, penetration holes having a diameter of 100 μm were made in the multilayer board with a carbon dioxide gas laser at 15 mJ. The surfaces thereof were treated by desmearing treatment. Electroless copper plating was carried out to form an electroless copper plating layer having a thickness of 2 μm. An electrolytic copper plating layer having a thickness of 16 μm was formed thereon. Then, a pattern having a line/space=25/25 μm was formed in the same manner as in Comparative Example 2. The pattern had undercuts and the form thereof was triangular and was defective. Table 4 shows the results of evaluations.

Comparative Example 15

Acrylonitrile-butadiene rubber (trade name: N210 S, supplied by JSR Corporation) in an amount of 3 parts was added to the same varnish as that obtained in Example 6 in an amount of 100 parts as a solid content, and the components were homogeneously stirred and mixed. Then, prepreg was prepared similarly to Example 6. Thereafter, the same procedures as those in Example 8 were carried out to perform a laminate-formation and to obtain a double-side copper-clad laminate. The copper foils as the external layers and the nickel/cobalt layers were removed by etching. Then, penetration holes having a diameter of 100 μm were made in the copper-clad laminate with a carbon dioxide gas laser at 10 mJ. The surfaces thereof were treated by desmearing treatment. The entire surface was plated by electroless copper plating to form a 4 μm thick electroless copper plating layer. An electrolytic copper plating resist was attached. A 16 μm thick electrolytic copper plating layer was formed on the electroless copper plating layer in portions where the plating resist was not attached. After the plating resist was removed, the entire surface was etched to dissolve and remove the thin electroless copper plating layer and to form a pattern having a line/space=20/20 μm. The pattern had undercuts. Table 4 shows the results of evaluations.

TABLE 4

|  | Examples | | Comparative Examples | | | |
| --- | --- | --- | --- | --- | --- | --- |
|  | 7 | 8 | 12 | 13 | 14 | 15 |
| Undercut (μm) | <1 | <1 | 5.5 | <1 | 2.2 | 6.1 |
| Form of pattern cross-section | good | good | Defective | Triangular | Triangular | Defective |
| Adhesion strength to copper foil (kgf/cm) | 1.27 | 1.10 | 0.67 | 0.90 | 0.43 | 0.55 |
| Grass transition temperature (° C.) | 235 | 160 | 235 | 160 | 235 | 154 |
| Anti-migration properties | | | | | | |
| Ordinary state | $6 \times 10^{14}$ | $4 \times 10^{14}$ | $5 \times 10^{14}$ | $4 \times 10^{14}$ | $5 \times 10^{14}$ | $5 \times 10^{14}$ |
| 200 hours | $2 \times 10^{11}$ | $5 \times 10^{8}$ | $3 \times 10^{11}$ | $2 \times 10^{8}$ | $4 \times 10^{11}$ | $2 \times 10^{8}$ |
| 500 hours | $4 \times 10^{10}$ | $<10^{8}$ | $7 \times 10^{10}$ | $<10^{8}$ | $5 \times 10^{10}$ | $<10^{8}$ |

What is claimed is:

1. A process for the production of a high-density printed wiring board, comprising the steps of
   (1) providing an ultrathin-copper-foil-clad board having a through hole and/or a blind via hole formed therein and having an outermost copper foil thickness of 5 μm or less, plating the surface thereof including the inside of the hole by electroless copper plating to form an electroless copper plating layer having a thickness of 0.1 to 1 μm,
   (2) forming an electrolytic copper plating layer having a thickness of 0.5 to 3 μm by using the electroless copper plating layer as an electrode,
   (3) forming a plating resist layer for pattern electrolytic copper plating on a necessary portion of the copper plating layer,
   (4) forming a pattern copper plating layer having a thickness of 6 to 30 μm on the copper surface in a portion where the plating resist layer is not formed, by electrolytic copper plating,
   (5) removing the plating resist layer, and
   (6) etching the entire surface to dissolve and remove the thin electrolytic copper layer, the electroless copper layer and the ultrathin copper foil layer in at least a portion where the pattern copper plating layer is not formed.

2. A process according to claim 1, wherein the plating resist layer is a positive type resist layer.

3. A process according to claim 2, wherein, after the plating resist layer is formed, exposure to an ultraviolet laser beam is carried out and the plating resist layer in a portion exposed to the ultraviolet laser beam is dissolved and removed.

4. A process according to claim 2, wherein the positive type resist contains an alkali-soluble resin and an acid generator.

5. A process according to claim 1, wherein the ultrathin-copper-foil-clad board is a copper-foil-clad board having an electrolytic copper foil having a thickness of 5 μm or less as an outermost layer and having at least two copper foil layers.

6. A process according to claim 5, wherein the ultrathin-copper-foil-clad board is at least one member selected from the group consisting of an inorganic or organic-base-material-reinforced thermosetting resin copper-clad laminate, a multilayer copper-clad laminate thereof, a multilayer board having a resin-attached copper foil sheet as a external layer, and a copper-clad laminate containing a film base material.

7. A process according to claim 1, wherein the through hole and/or the blind via hole is/are made by irradiation with a carbon dioxide gas laser at a pulse energy of 5 to 60 mJ by means of its pulse oscillation.

8. A process according to claim 7, wherein burrs around the hole are removed by an etching treatment with a chemical and at the same time both the external copper foils are flatly partially removed in a thickness direction.

* * * * *